(12) United States Patent  (10) Patent No.: US 6,708,702 B2
Kamikawa  (45) Date of Patent: Mar. 23, 2004

(54) LIQUID PROCESSING APPARATUS WITH STORAGE TANK HAVING AN INTERNAL AND EXTERNAL TANK

(75) Inventor: Yuji Kamikawa, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 353 days.

(21) Appl. No.: 09/729,227

(22) Filed: Dec. 5, 2000

(65) Prior Publication Data

US 2001/0003067 A1 Jun. 7, 2001

(30) Foreign Application Priority Data

Dec. 6, 1999 (JP) .......................... 11-346000
Apr. 4, 2000 (JP) ...................... 2000-101742

(51) Int. Cl.$^7$ .............................................. B08B 3/00
(52) U.S. Cl. ........................ 134/186; 134/111; 134/902; 220/23.83
(58) Field of Search ............................. 68/18 R, 18 F; 134/109, 110, 111, 186, 902; 220/23.83, 23.86, 23.87, 23.89

(56) References Cited

U.S. PATENT DOCUMENTS 5,799,676 A * 9/1998 Goto et al. .................... 134/61
5,839,456 A * 11/1998 Han ......................... 134/104.1
5,904,737 A * 5/1999 Preston et al. ................. 8/158

* cited by examiner

Primary Examiner—Randy Gulakowski
Assistant Examiner—Joseph L Perrin
(74) Attorney, Agent, or Firm—Smith, Gambrell & Russell, LLP

(57) ABSTRACT

There is provided a liquid processing apparatus for carrying out a process, such as cleaning, with a chemical serving as a processing liquid, with respect to a semiconductor wafer (W) which serves as an object to be processed and which is housed in a processing chamber. A chemical tank (10) for storing therein the chemical has a double vessel structure which has an external tank (2) and an internal tank (1) housed in the external tank (2). Supply pipe-lines (14a, 14b and 14c) are provided for supplying the chemical from the external tank (2) and the internal tank (1) to the processing chamber. A return pipe-line (56) is provided for returning the chemical from the processing chamber to the external tank (2). The outer periphery of the external tank (2) is surrounded by a heater (4).

8 Claims, 21 Drawing Sheets

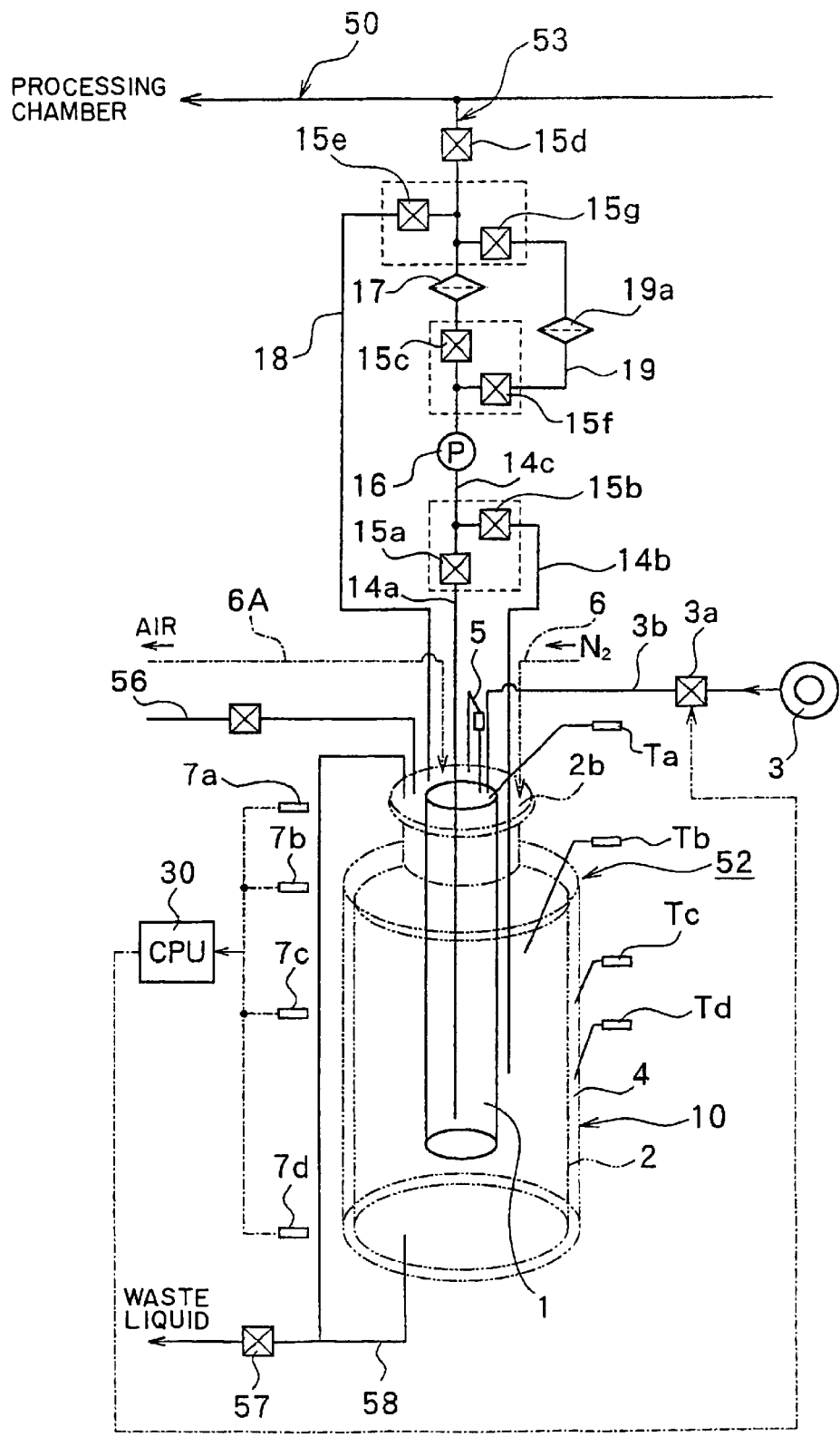
F I G. 3

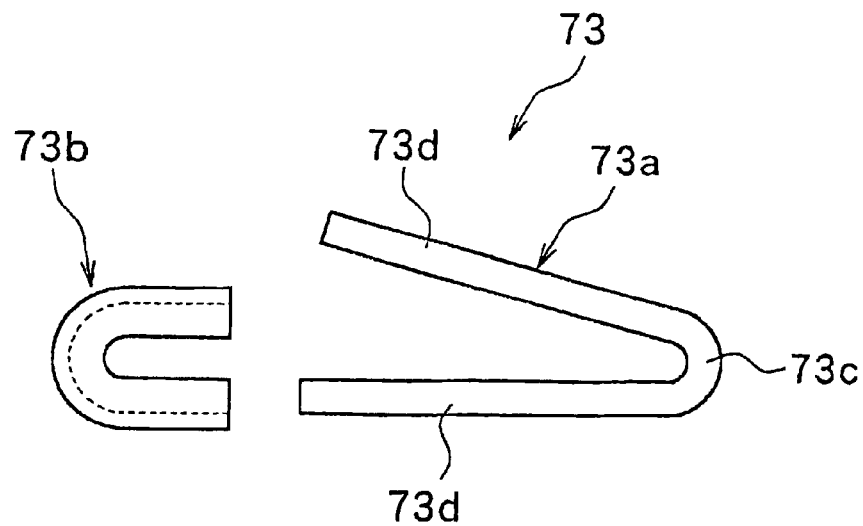
F I G. 14
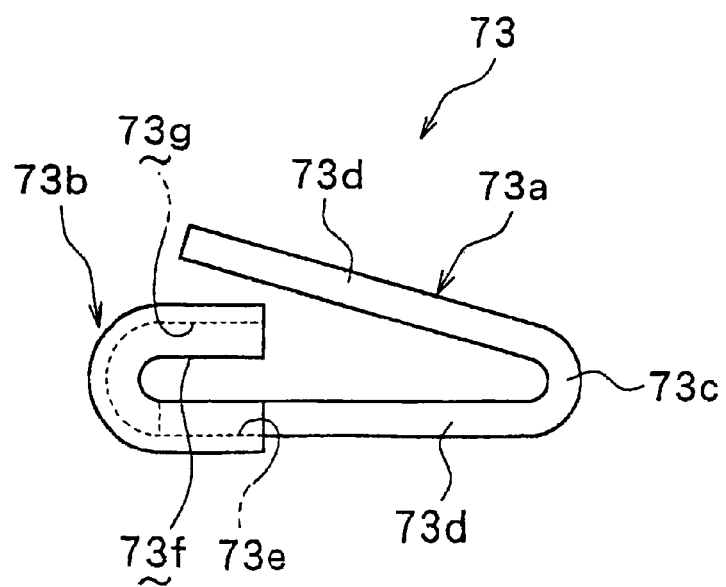
F I G. 15

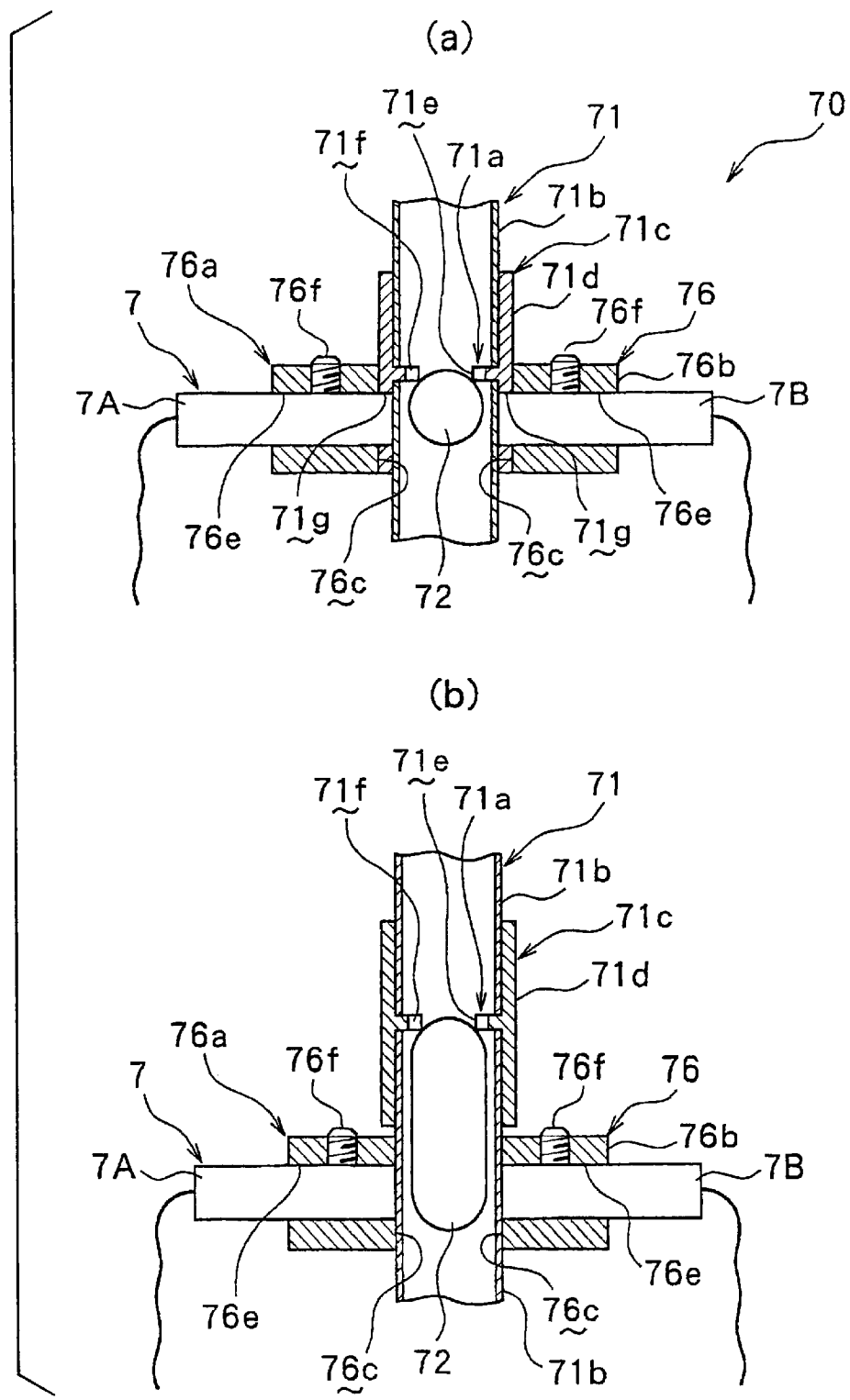
F I G. 23

LIQUID PROCESSING APPARATUS WITH STORAGE TANK HAVING AN INTERNAL AND EXTERNAL TANK

BACKGROUND OF THE INVENTION

1. Field of the Invention

The present invention relates generally to a processing apparatus and a processing method, each using a processing liquid. More specifically, the invention relates to a processing apparatus and method for supplying a liquid chemical or the like serving as a processing liquid to objects to be processed, such as semiconductor wafers or glass substrates for LCDs, to carry out a process, such as wet cleaning.

2. Description of the Related Art

In typical processes for producing semiconductor devices and LCDs, processing apparatuses and methods using processing liquids have been widely adopted in order to remove resists which adhere to objects to be processed (which will be hereinafter referred to as "wafers or the like"), such as semiconductor wafers or glasses for LCDs, and residues, such as polymers, which adhere to the surfaces of the wafers or the like after drying processes.

In conventional processes of this type, a cleaning method for reusing a processing liquid, such as an expensive chemical, which has been used for a process, as a recycle liquid to effectively utilize the processing liquid is known.

In a method using this recycle liquid and a new processing liquid, two kinds of tanks for storing therein the new processing liquid and the recycle liquid are prepared. After the recycle liquid is supplied to a processing chamber in the early part of a process to carry out a primary process for wafers or the like, the new processing liquid is used for carrying out a secondary process, so that the processing liquids are effectively utilized.

However, in a conventional process of this type, it is required to provide two kinds of tanks for storing therein the new processing liquid and the recycle liquid. It is also required to equip each of the tanks with apparatuses, such as a temperature controller and a supply pump, and to arrange supply pipe-lines. Therefore, there are problems in that spaces for providing the tanks, spaces for providing the apparatuses, such as the temperature controller and the supply pump, and piping spaces are not only increased to increase the size of the whole apparatus, but the apparatus is also expensive.

SUMMARY OF THE INVENTION

It is therefore an object of the present invention to eliminate the aforementioned problems and to provide a liquid processing apparatus and method capable of scaling down the apparatus by decreasing spaces for a plurality of tanks for storing therein processing liquids, which are supplied to a processing chamber, and spaces for piping or the like, and capable of effectively utilizing the processing liquids.

In order to accomplish the aforementioned and other objects, according to one aspect of the present invention, there is provided a liquid processing apparatus comprising: a processing chamber for processing an object to be processed, with a processing liquid; a processing liquid tank for storing therein the liquid, the processing liquid tank having an external tank and an internal tank which is housed in the external tank; a supply pipe-line for supplying the liquid to the chamber from the external tank and the internal tank; and a return pipe-line for returning the liquid from the chamber to the external tank.

According to this processing apparatus, the processing liquid used for the process can be stored in the internal tank and external tank of the processing liquid tank, and the processing liquid in the external tank can be supplied to the processing chamber to carry out the process. Then, the processing liquid used for the process can be returned to the external tank, and thereafter, the new processing liquid in the internal tank can be supplied to the processing chamber. Thus, the process, which has conventionally required a plurality of processing tanks, can be carried out by a single processing liquid tank. Therefore, the installation space for providing the processing liquid tank and the piping space for providing the pipe-lines can be decreased, so that the size of the apparatus can be decreased.

According to the same aspect of the present invention, there is also provided a liquid processing apparatus comprising: a processing liquid tank for storing therein the processing liquid for processing an object to be processed, the processing liquid tank having an external tank and an internal tank which is housed in the external tank; and a heater surrounding the external tank.

According to this processing apparatus, the processing liquids in the external and internal tanks can be heated and heat-retained by a single heater.

Preferably, this processing apparatus further comprises: a heating temperature sensor for detecting a heating temperature of the heater; an external tank liquid temperature sensor for detecting the temperature of the processing liquid in the external tank; and a temperature controller for controlling the temperature of the processing liquid in the external and internal tanks, on the basis of detected values of the heating temperature sensor and external tank liquid temperature sensor.

Thus, the temperatures of the processing liquids in the external and internal tanks can be controlled so as to be appropriate temperatures.

In this case, the heater preferably has a plurality of heating bodies separated from each other in circumferential directions of the external tank, and adjacent two of the heating bodies are preferably connected to each other so as to be capable of approaching and going away from each other in the circumferential directions.

Thus, the heating efficiency can be improved by causing the heating bodies to follow the expansion and contraction of the external tank depending on the heating by means of the heater.

Preferably, the above described processing apparatus further comprises: a processing liquid supply source for supplying the liquid; a processing liquid pipe-line for supplying the liquid from the processing liquid supply source to the internal tank; and an overflow pipe-line for supplying a part of the liquid, which overflows the internal tank, to the external tank.

According to this processing apparatus, when the external and internal tanks are empty, the processing liquid from the processing liquid supply source can be stored in the internal tank, and can overflow the internal tank to be stored in the external tank.

The external tank may have a barrel portion and an opening portion provided in an upper portion of the barrel portion. Preferably, in this case, and a gap size between the external tank and the internal tank at the opening portion is preferably greater than half inches, and designed so that a cross section of the external tank at the opening portion is smaller than a cross section of the external tank at the barrel portion.

Thus, it is possible to decrease the area of the processing liquid in the external tank contacting a gaseous phase to inhibit the chemical reaction and deterioration of the processing liquid, so that it is possible to maintain the quality and performance of the processing liquid.

Preferably, in this case, the processing apparatus further comprises: a purge gas supply pipe-line, which is connected to said opening portion of said external tank, for supplying a purge gas to said external tank; and a vent pipe-line for exhausting said purge gas which is supplied to said external tank by said purge gas supply pipe-line.

Thus, it is possible to prevent the processing liquid stored in the external tank from being exposed to outside air to vary atmosphere.

The supply pipe-line preferably comprises: a first supply pipe-line connected to the external tank; a second supply pipe-line connected to the internal tank; a main supply pipe-line, into which the first and second supply pipe-lines are combined; a supply pipe-line switching apparatus for switching a pipe-line, which is communicated with the main supply pipe-line, between the first supply pipe-line and the second supply pipe-line; and a supply pump provided in the main supply pipe-line.

Thus, the external and internal tanks can share a part of the supply pipe-line and the supply pump, so that it is possible to decrease the size of the apparatus and to lower the price of the apparatus.

Preferably, in this case, the processing apparatus further comprises a circulating pipe-line connecting a discharge side of the supply pump in the main supply pipe-line to the external tank.

By circulating the processing liquid in the external tank by means of the circulating pipe-line during the waiting for the supply of the processing liquid, the processing liquid can be immediately supplied to the processing chamber when the supply is started. Therefore, it is possible to improve the time efficiency of the process. By circulating the processing liquid in the external tank, it is possible to enhance the uniformity of the temperature distribution of the processing liquid, and to enhance the uniformity of the temperature distribution of the processing liquid in the internal tank, which is heat-exchanged between the processing liquids in the external and internal tanks. Thus, it is possible to improve the reliability and performance of the process.

Preferably, in this case, the supply pipe-line further comprises: a bypass pipe-line connected to the discharge side of the supply pump in the main supply pipe-line so as to bypass the main supply pipe-line; a bypass switching apparatus for switching a flow of the processing liquid from the supply pump between the main supply pipe-line and the bypass pipe-line; and a filter provided in the bypass pipe-line.

Thus, the supply pipe-line can be switched between the main supply pipe-line and the bypass pipe-line with respect to, e.g., the new processing liquid and the recycle liquid which has used for the process. In this case, the supply pipe-line can be switched so that only the recycle liquid having used for the process flows through the bypass pipe-line to be filtered by the filter, so that it is possible to increase the life of the supply pipe-line and so forth.

According to another aspect of the present invention, there is provided a liquid processing method for supplying a processing liquid from a processing liquid tank, which has an external tank and an internal tank housed in the external tank, to a processing chamber to carry out a process with respect to an object to be processed, with the processing liquid in the processing chamber, the processing method comprising: a step of storing a processing liquid, which is supplied from a processing liquid supply source, in the internal tank, and storing a part of the liquid, which overflows the internal tank, in the external tank; a first processing step of supplying the part of the liquid in the external tank to the chamber to carry out the process; a step of returning the part of the liquid, which has been used for the process at the first processing step, to the external tank; and a second processing step of supplying the liquid in the internal tank to the chamber after the first processing step, to carry out the process.

According to the same aspect of the present invention, there is also provided a liquid processing method for supplying a processing liquid from a processing liquid tank, which has an external tank and an internal tank housed in the external tank, to a processing chamber to carry out a process with respect to an object to be processed, with the liquid in the chamber, the processing method comprising: a step of storing a recycle processing liquid, which has been used for the process at least once in the chamber, in the external tank; a recycle liquid processing step of supplying the recycle processing liquid in the external tank to the chamber to carry out the process; a new liquid processing step of supplying the new processing liquid stored in the internal tank to the chamber after the recycle liquid processing step, to carry out the process.

Preferably, in the above described processing method, the liquid in the external tank is heated by a heater surrounding the external tank, the liquid in the internal tank is heated by a conductive heat from the liquid in the external tank, and a heating temperature of the heater and a temperature of the liquid in the external tank are detected to control a temperature of the liquid in the external and internal tanks, on the basis of detected values of the heating temperature and the liquid temperature.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 3 is a diagram showing the details of a chemical supply part in the apparatus shown in FIG. 1;

FIG. 14 is an exploded front view showing a clip in FIG. 13;

FIG. 15 is a front view showing another clip;

FIG. 23 shows sectional views of other examples of position sensors;

DESCRIPTION OF THE PREFERRED EMBODIMENTS

Referring now to the accompanying drawings, the preferred embodiments of a liquid processing apparatus and method according to the present invention, which are applied to a cleaning/drying apparatus for semiconductor wafers, will be described below.

First Preferred Embodiment

First, referring to FIGS. 1 through 7, the first preferred embodiment of a liquid processing apparatus serving as a cleaning/drying apparatus according to the present invention will be described below.

Figure 1:
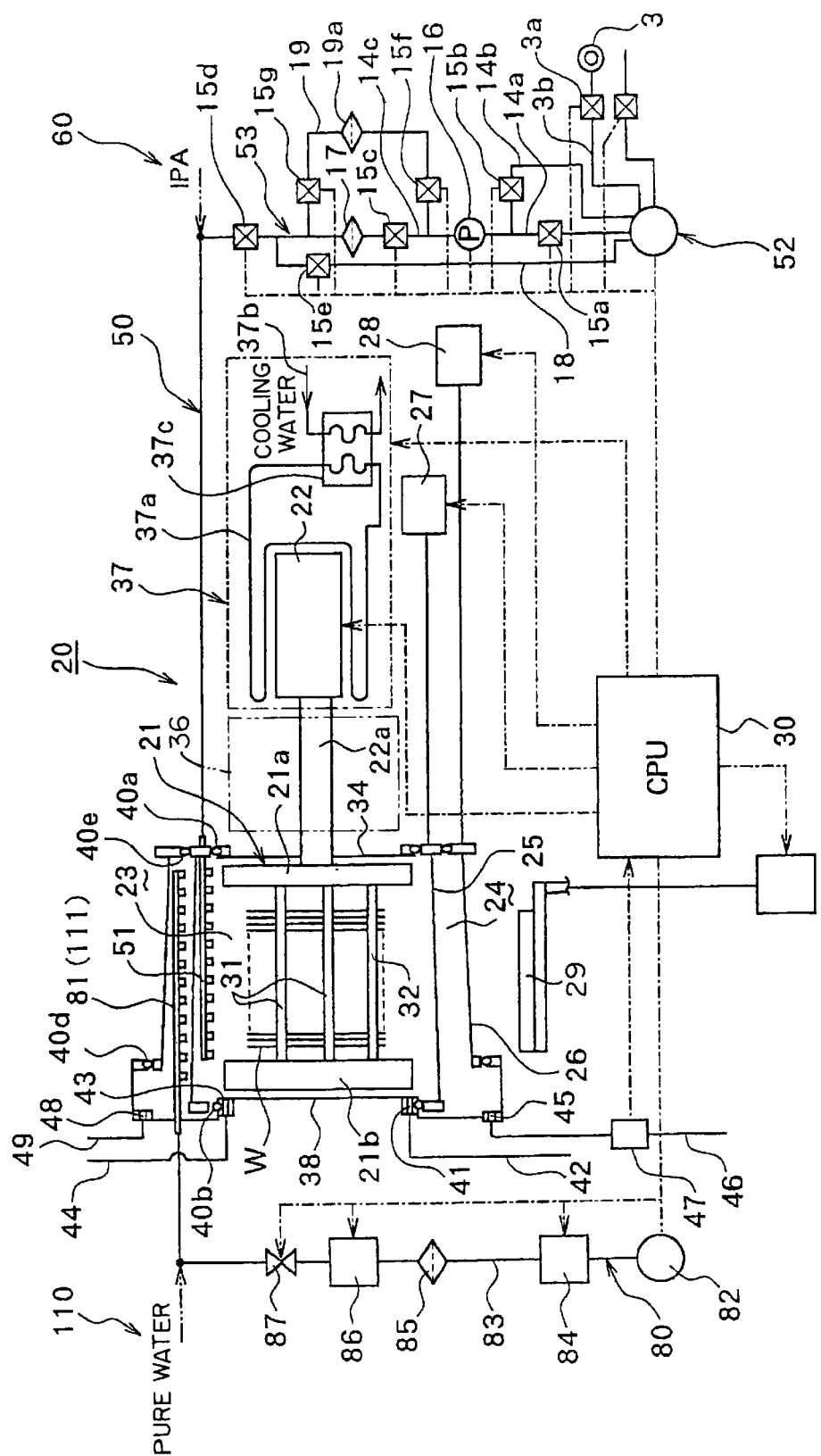
FIG. 1 is a schematic block diagram of a cleaning/drying apparatus as the first preferred embodiment of a liquid processing apparatus according to the present invention.

As shown in FIG. 1, this liquid processing apparatus 20 mainly comprises:

a rotor 21 serving as a rotatable holding means for holding semiconductor wafers W which are objects to be processed;

a motor 22 serving as a driving means for rotating the rotor 21 about a horizontal axis;

internal and external chambers 23 and 24 serving as a plurality of processing chambers, two processing chambers in this preferred embodiment, for surrounding the wafers W which are held by the rotor 21;

a chemical supply means 50 for supplying a liquid chemical (e.g., a resist releasing liquid or a polymer removing liquid), serving as a processing liquid, to the wafers W which are housed in the internal chamber 23 or the external chamber 24;

a supply means 60 for supplying isopropyl alcohol (IPA) serving as a solvent for the chemical;

a supply means 110 for supplying pure water serving as a rinsing liquid; and a supply means 80 for supplying nitrogen gas serving as a drying fluid.

The processing apparatus 20 further comprises first and second cylinders 27 and 28, and a wafer delivering hand 29. The first and second cylinders 27 and 28 constitute moving means for moving an internal cylindrical body 25 constituting the internal chamber 23 and an external cylindrical body 26 constituting the external chamber 24, respectively, between a surrounding position, at which the wafers W are surrounded, and a standby position which is spaced from the surrounding position. The wafer delivering hand 29 constitutes a delivery means for delivering the wafers W between a wafer transport chuck (not shown) and the rotor 21.

The motor 22, the respective supply means 50, 60, 110 and 80 for supplying processing fluids, the wafer delivering hand 29 and so forth of the processing apparatus 20 with the above described constructions are controlled by a central processing unit 30 (which will be hereinafter referred to as a CPU 30) serving as a controller.

The rotor 21 is connected to a driving shaft 22a of the motor 22, which is horizontally arranged, so as to be an overhung type. The rotor 21 is designed to hold the wafers W so that the processed surfaces of the wafers W extend vertically, and to be rotatable about a horizontal axis. The rotor 21 comprises a first turntable 21a, a second turntable 21b facing the first turntable 21a, and a plurality of fixing/holding rods 31, four fixing/holding rods 31 in this preferred embodiment, which are provided between the first and second turntables 21a and 21b. The first turntable 21a has a rotational shaft (not shown) which is connected to the driving shaft 22a via a coupling (not shown). The fixing/holding rods 31 are provided with holding grooves (not shown) in parallel. A pair of presser bars 32 is provided for pressing the lower portions of the wafers W which are held in the holding grooves. The presser bars 32 are selectively moved by locking and unlocking means (not shown) between a pressing position and a non-pressing position.

The motor 22 is controlled so as to be capable of selectively repeating predetermined high-speed and low-speed rotations on the basis of a program which has been stored in the CPU 30. The overheat of the motor 22 is suppressed by a cooling means 37. The cooling means 37 comprises a cooling pipe 37a, a cooling water supply pipe 37b and a heat exchanger 37c.

On the other hand, the internal chamber 23 serving as a processing chamber comprises a first fixed wall 34, a second fixed wall 38 facing the first fixed wall 38, and an internal cylindrical body 25 which engage the first and second fixed walls 34 and 38 via first and second sealing members 40a and 40b. That is, the internal cylindrical body 25, together with the rotor 21, is moved by the extension of the first cylinder 27 to the position, at which the wafers W are surrounded, to form the internal chamber 23 while being sealed on the first fixed wall 34 via the first sealing member 40a and while being sealed on the second fixed wall 38 via the second sealing member 40b.

The internal cylindrical body 25 is designed to move to a position (standby position) on the side of the outer periphery of a fixed cylindrical body 36 by the contraction of the first cylinder 27. The tip opening portion of the internal cylindrical body 25 is sealed on the first fixed wall 34 via the first sealing member 40a, and the base end portion of the internal cylindrical body 25 is sealed via a third sealing member (not shown) which is provided on the periphery of the intermediate portion of the fixed cylindrical body 36. Thus, the atmosphere of the chemical remaining in the internal chamber 23 is prevented from leaking to the outside.

The internal cylindrical body 25 is formed of a stainless steel having a good chemical resistance and a high strength. The heat retaining property of the internal cylindrical body 25 can be improved by forming the internal cylindrical body 25 of a stainless steel, on which a fluorine containing synthetic resin, such as PTFE or PFA, is coated or stuck, or of a fluorine containing synthetic resin, such as PTFE or PFA.

The external chamber 24 serving as a processing chamber comprises the first fixed wall 34 which is provided with the sealing member 40b between the first fixed wall 34 and the internal cylindrical body 25 moved to the standby position, the second fixed wall 38, and the external cylindrical body 26 which engages the second fixed wall 38 and the internal cylindrical body 25 via fourth and fifth sealing members 40d and 40e. That is, the external cylindrical body 26, together with the rotor 21, is moved by the extension of the second cylinder 28 to the position, at which the wafers W are surrounded, to form the external chamber 24 while being sealed on the second fixed wall 38 via the fourth sealing member 40d and while being sealed on via the fifth sealing member 40e which is positioned outside of the tip portion of the internal cylindrical body 25.

The external cylindrical body 26 is designed to move the position (standby position) on the side of the outer periphery of the fixed cylindrical body 36 by the contraction of the second cylinder 28. In this case, the fifth sealing member 40e is provided between the external cylindrical body 26 and the internal cylindrical body 25 to seal therebetween. Therefore, since the atmosphere in the internal chamber 23 is fluid-tightly separated from the atmosphere in the external chamber 24, the atmospheres in both chambers 23 and 24 are not mixed with each other, so that it is possible to prevent the cross-contamination which is caused by a reaction between different processing fluids.

Similar to the internal cylindrical body 25, the external cylindrical body 26 is formed of a stainless steel having a good chemical resistance and a high strength. Similar to the internal cylindrical body 25, the heat retaining property of the external cylindrical body 26 can be improved by forming the external cylindrical body 26 of a stainless steel, on which a fluorine containing synthetic resin, such as PTFE or PFA, is coated or stuck, or of a fluorine containing synthetic resin, such as PTFE or PFA.

Each of the internal and external cylindrical bodies 25 and 26 with the above described constructions is formed so as to have a divergent shape which expands toward its tip. By thus forming each of the internal and external cylindrical bodies 25 and 26 so as to have a divergent shape which expands toward its tip, the air flow produced when the rotor 21 rotates in the internal and external cylindrical bodies 25 and 26 flows spirally toward the divergent tip, so that the internal chemical or the like can be easily discharged to the divergent tip. If the internal and external cylindrical bodies 25 and 26 are thus arranged so as to have the same axis, it is possible to decrease the space for providing the internal and external cylindrical bodies 25 and 26 and the internal and external chambers 23 and 24, and it is possible to decrease the size of the apparatus.

Figure 2:
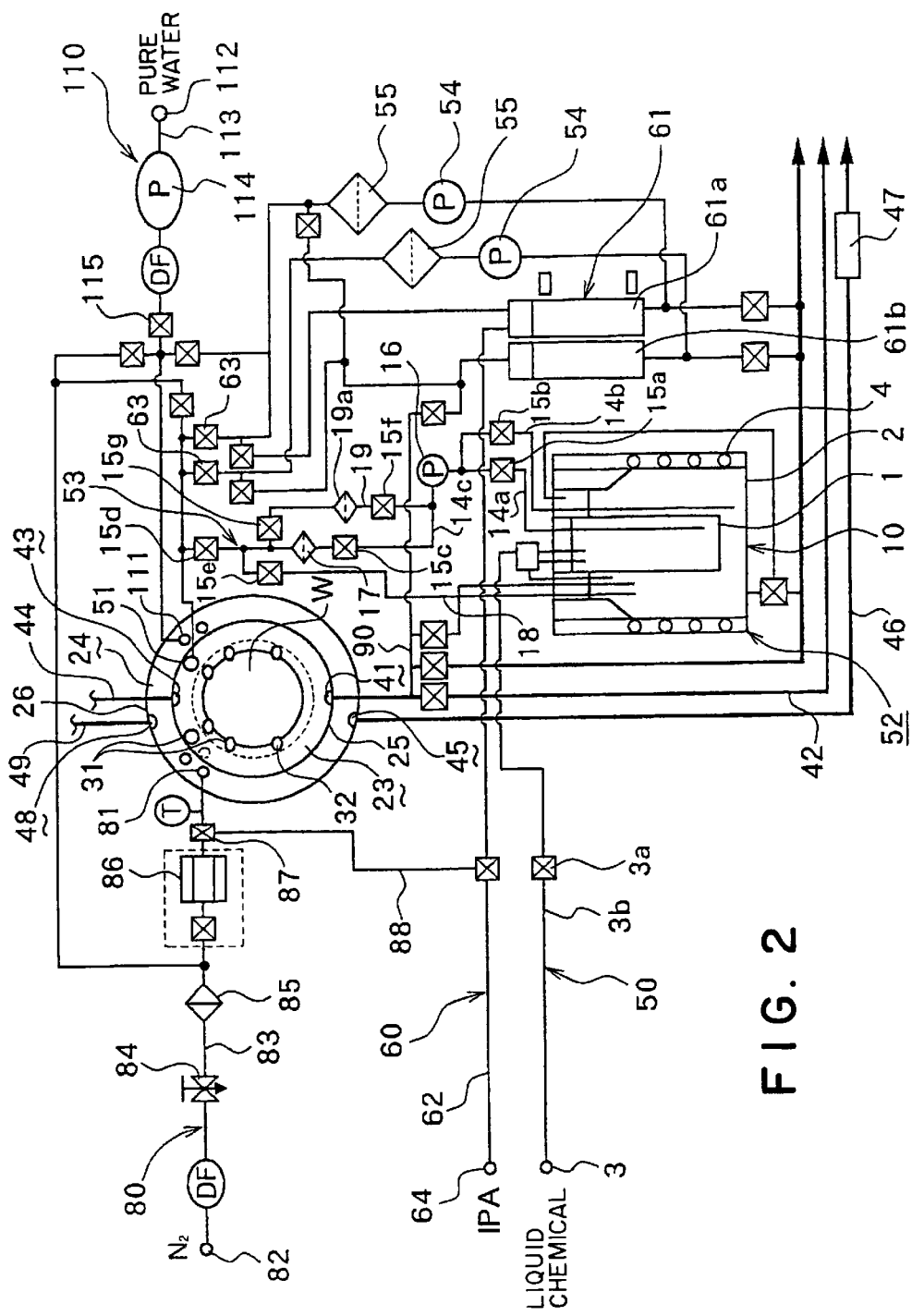
FIG. 2 is a schematic piping diagram showing a piping apparatus for processing liquids in the apparatus shown in FIG. 1.

On the other hand, as shown in FIG. 2, the supply means 50 for supplying the chemical, such as the polymer removing liquid, comprises a chemical supply nozzle 51 which is mounted in the internal cylindrical body 25 serving as a processing chamber, a chemical supply part 52, and a chemical supply pipe-line 53 for connecting the chemical supply nozzle 51 to the chemical supply part 52.

As shown in FIG. 3, the chemical supply part 52 mainly comprises a chemical supply source (processing liquid supply source) 3, and a chemical tank (processing liquid tank) 10 capable of storing therein a new chemical which is supplied from the chemical supply source 3, and a chemical (recycle chemical) which has been used for the process.

The tank 10 has a double vessel structure which has an internal tank 1 for storing therein the new chemical, and an external tank 2 housing therein the internal tank 1. The internal tank 1 is formed of a cylindrical stainless vessel with bottom, and connected to the chemical supply source 3 via a chemical pipe-line 3b in which a chemical shut-off valve is provided.

The external tank 2 is formed of a cylindrical stainless vessel with bottom, which has a barrel portion 2a, an opening portion 2b having a smaller diameter than that of the barrel portion 2a, and a shoulder portion 2c connecting the barrel portion 2b to the opening portion 2b. The shoulder portion 2c is gradually tapered from the barrel portion 2a toward the opening portion 2b. The reason why the shoulder portion 2c is gradually tapered toward the opening portion 2b is that air is prevented from being accumulated in the shoulder portion 2c while the chemical stored in the external tank 2 is filled to the opening portion 2b. A heater 4 is provided so as to surround the outer peripheral face of the external tank 2.

Figure 4:
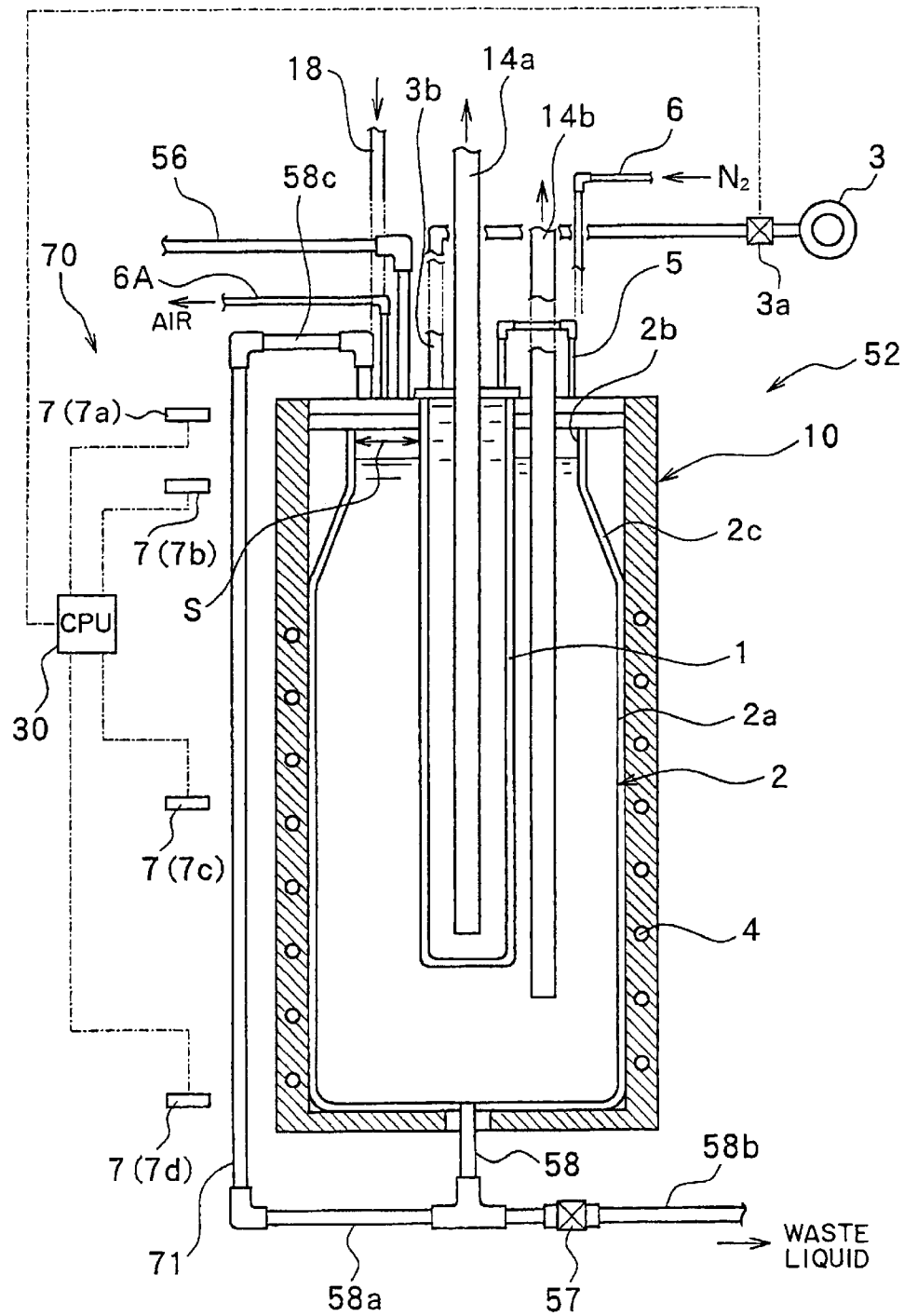
FIG. 4 is a sectional view of a chemical tank shown in FIG. 3.

In the top end portion of the chemical tank 10, an overflow pipe-line 5 for supplying the chemical overflowing from the internal tank 1 into the external tank 2 is provided (see FIG. 4). Therefore, after the new chemical supplied from the chemical supply source 3 into the internal tank 1 is filled in the internal tank 1, the new chemical is supplied into the external tank 2 via the overflow pipe-line 5. As shown in FIGS. 3 and 4, a narrow gap S is formed between the opening portion 2b of the external tank 2 and the internal tank 1. The size of this gap S, in the radial direction of the tanks 1 and 2, is preferably as small as possible if the liquid level of the chemical stored in the external tank 2 can be detected.

The reason for this is that, as the gap S between the internal tank 1 and the external tank 2 is narrow, the area (the sectional area of the external tank 2 at the opening portion 2b) at the liquid level of the chemical, which is stored in the external tank 2 and which contacts a gaseous phase, is small, so that it is possible to inhibit the chemical reaction of the chemical with the gaseous phase and the deterioration of the chemical to maintain the quality and performance of the chemical. Specifically, the size of the gap S is preferably set so that the sectional area of the external tank 2 at the opening portion 2b is smaller than half of the sectional area of the external tank 2 at the barrel portion 2a. However, it is required to connect various pipe-lines, which will be described later, in accordance with the opening portion 2b of the external tank 2. Considering that the practical minimum diameter of the piping is ½ inches (about 1.27 cm), the size of the gap S must be greater than ½ inches.

A purge gas supply pipe-line 6 and a vent pipe-line 6A are connected to the opening portion of the external tank 2. In order to prevent the chemicals stored in both tanks 1 and 2 from being exposed to outside air to vary atmosphere, nitrogen gas serving as a purge gas is supplied from the purge gas supply pipe-line 6 and exhausted from the vent pipe-line 6A. The purge gas is supplied to the internal tank 1 via the overflow pipe-line 5, when the internal tank 1 is not filled up with the chemicals.

Adjacent to and outside of the external tank 2, an upper limit sensor 7a, a measuring sensor (optimum amount sensor) 7b, a heater-off lower-limit sensor (replenishment sensor) 7c and a lower limit sensor 7d are provided as electrical capacitance type position sensors. These sensors 7a through 7d are connected to the CPU 30. The sensors 7a through 7d should not be limited to capacitance type sensors, but the sensors may other types of sensors, such as dioptric fiber sensors, which can detect the liquid level. The upper limit sensor 7a and the lower limit sensor 7d are designed to detect the upper-limit and lower-limit liquid levels of the chemical which is stored in the external tank 2. The measuring sensor 7b is designed to detect the amount of the chemical which is actually stored in the external tank 2. The heater-off lower-limit sensor 7c is designed to detect the minimum amount of the chemical which can be heated by the heater 4.

On the top end portion of the internal tank 1, a chemical full sensor 7e is provided. The chemical full sensor 7e is designed to monitor the state of the chemical flowing from the internal tank 1 into the external tank 2. That is, the CPU 30 is designed to transmit a control signal to a chemical shut-off valve 3a on the basis of detection signals from the chemical full sensor 7e and the measuring sensor 7b, to control the amounts of the chemicals in the internal and external tanks 1 and 2. Thus, when the recycle chemical in the external tank 2 is insufficient, the new chemical can compensate the shortage of the recycle chemical.

The chemicals stored in the internal and external tanks 1 and 2 are heated and heat-retained by the heater 4 which surrounds the outer periphery of the external tank 2. The temperature of the chemical in the internal tank 1 is detected by an internal-tank liquid temperature sensor Ta, and the temperature of the chemical in the external tank 2 is detected by an external-tank liquid temperature sensor Tb. The temperature heated by the heater 4 is detected by a control temperature sensor Tc and overheat temperature sensor Td serving as heating temperature sensors.

Figure 5:
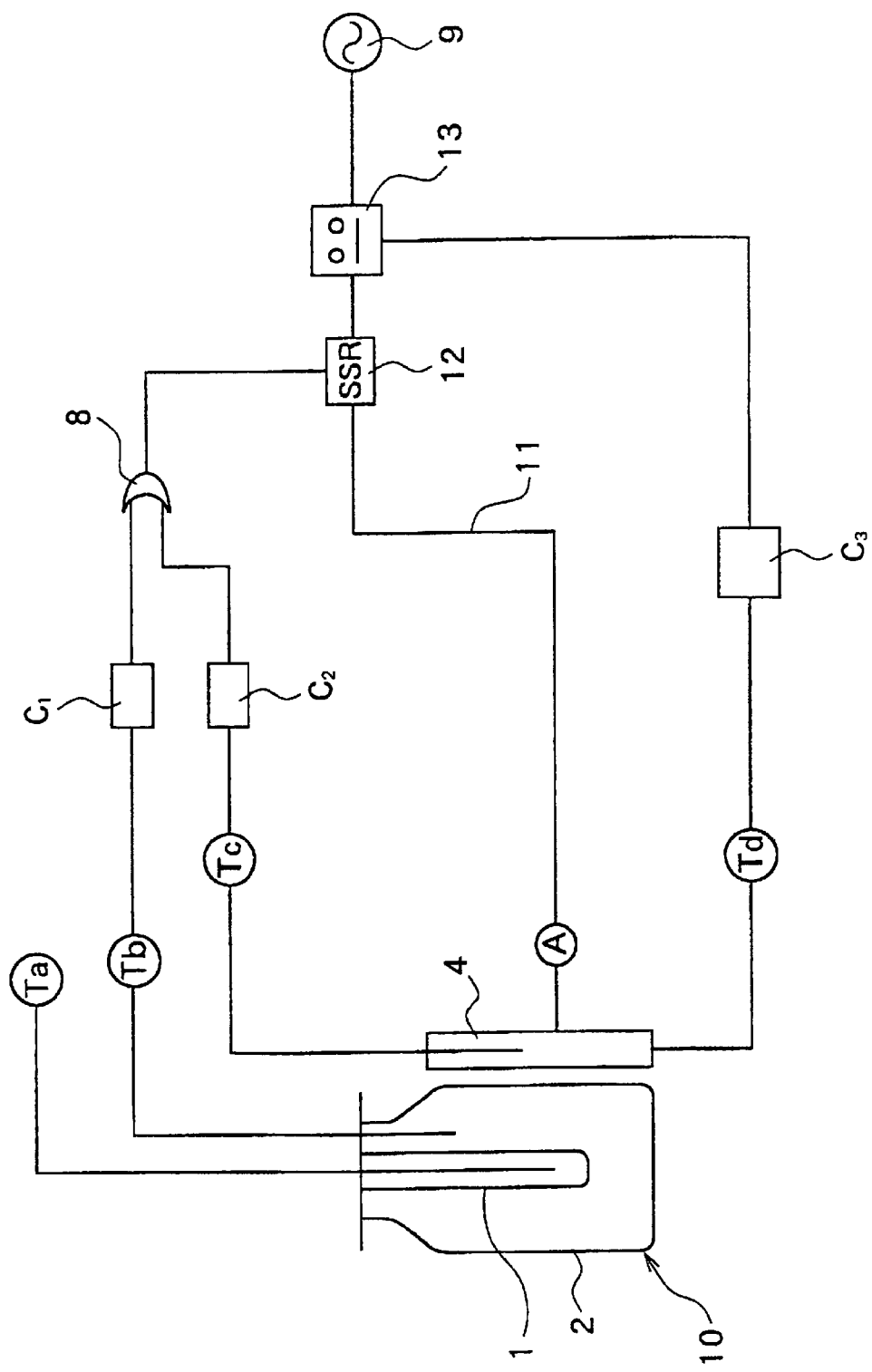
FIG. 5 is a block diagram of a temperature control apparatus for the chemical tank.

As shown in FIG. 5, the temperature of the chemical in the external tank 2 and the temperature heated by the heater 4 can be set to be predetermined temperatures by the control of temperature controllers C1 through C3 based on detection signals of the external-tank liquid temperature sensor Tb, control temperature sensor Tc and overheat temperature sensor Td.

That is, the detection signal of the external-tank liquid temperature sensor Tb is transmitted to the temperature controller C1 which determines whether the temperature T1 of the chemical in the external tank 2 is, e.g., 80° C. or lower. A signal indicative of the determined result is transmitted to a solid state relay 12 (SSR) via an AND circuit part 8. This SSR 12 is provided in a lead wire 11 which connects the heater 4 to a power supply 9.

On the other hand the detection signal of the control temperature sensor Tc is transmitted to the temperature controller C2 which determines whether the temperature T2 heated by the heater 4 is, e.g., 150° C. or lower. A signal indicative of the determined result is transmitted to the SSR 12 via the AND circuit part 8. Thus, the heater 4 is controlled so as to be turned ON when the chemical temperature T1 in the external tank 2<80° C. and when the temperature T2 heated by the heater 4<150° C., and OFF when the chemical temperature T1≧80° C. or when the heating temperature T2≧150° C.

The detection signal of the overheat temperature sensor Td is transmitted to the temperature controller C3 which determines whether the heater temperature T3 is higher or lower than, e.g., 200° C. When T3>200° C., a signal indicative thereof is transmitted to a magnet conductor 13 which is provided in the lead wire 11, so that the current-carrying to the heater 4 is interrupted.

By thus controlling the detection signals, which have been detected by the temperature sensors Tb through Td, by means of the temperature controllers C1 through C3, the chemical temperature T1 in the external tank 2 is controlled to be a predetermined temperature, i.e., a temperature of 80° C.<T1<150° C., so that the temperature T0 of the chemical in the internal tank 1 can be set to be substantially equal to the temperature T1 by the conduction from the chemical in the external tank 1.

Figure 6A:
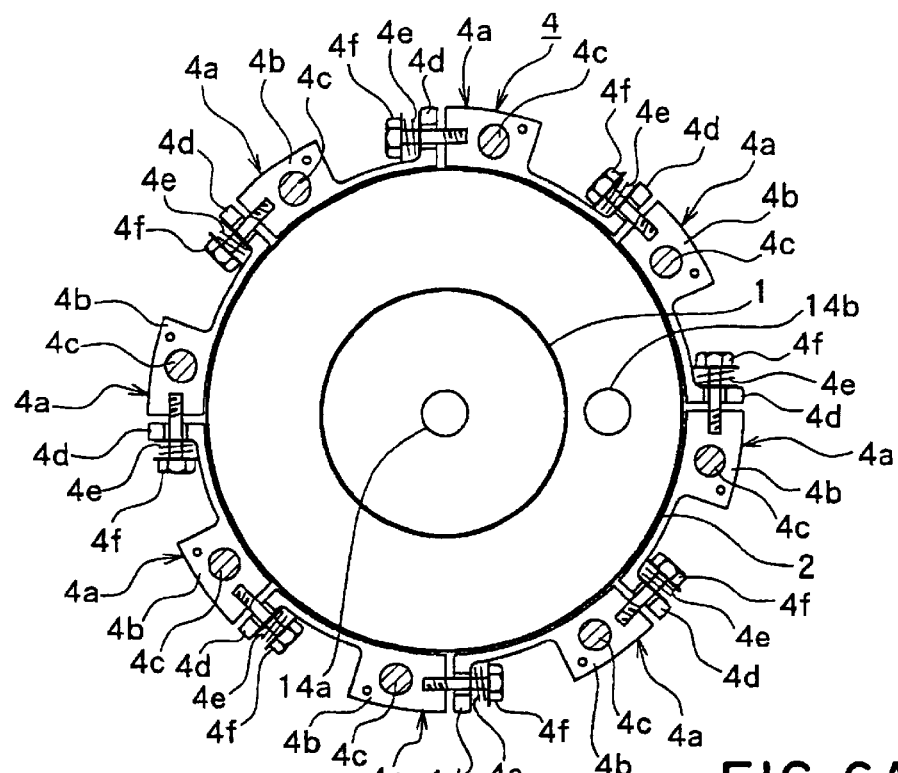
FIG. 6A is a horizontal sectional view showing the state of a heater which is mounted on the chemical tank.
Figure 6B:
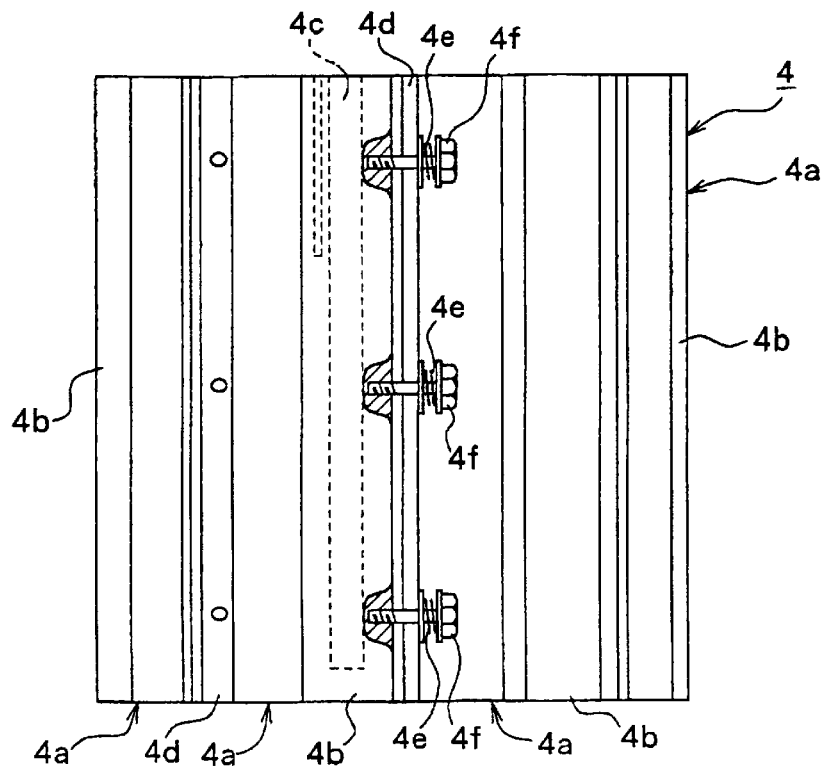
FIG. 6B is a side view showing the state of the heater which is mounted on the chemical tank.
Figure 7:
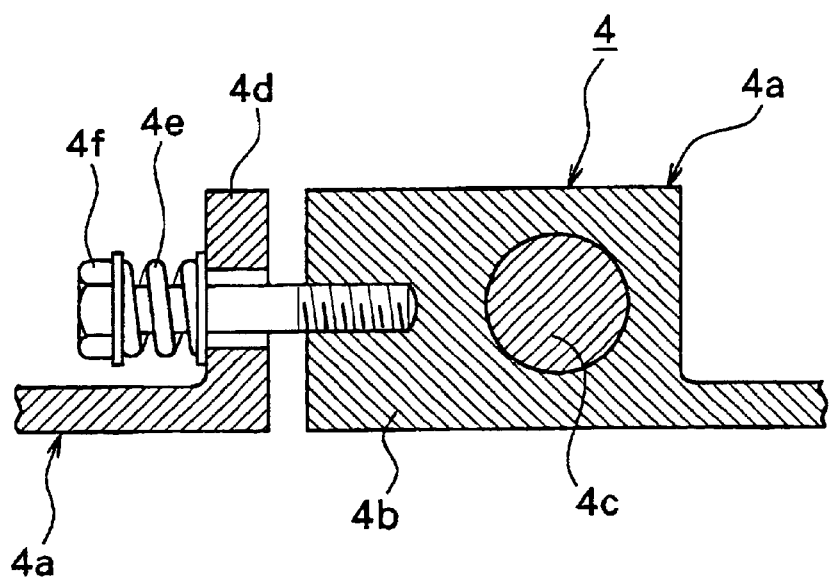
FIG. 7 is an enlarged view of a heater mounting portion shown in FIG. 6A.

As shown in FIGS. 6 and 7, the heater 4 has a plurality of separated heating bodies, eight separated heating bodies 4a in this preferred embodiment, which are arranged in circumferential directions so as to surround the external tank 2. The heating bodies 4a adjacent to each other in circumferential directions are connected to each other so as to be capable of approaching and going away from each other. In FIG. 4 and so forth, the shape of the cross section of the heater 4 is shown by different expression for convenience. Each of the heating bodies 4a has an extruded shape of aluminum, one side of which is formed so as to have a circular cross section corresponding to the outer periphery of the external tank 2. Each of the heating bodies 4a has a heater mounting portion 4b, in which a heater wire 4c is embedded (through which the heater wire 4c passes), on the side of one end thereof, and is formed with a connecting flange 4d on the side of the other end thereof. The heater mounting portion 4b and connecting flange 4d of each of the heating bodies 4a are connected to each other by a connecting bolt 4f via a coil spring 4e, so that the adjacent heating bodies 4a are connected so as to be capable of approaching and going away from each other.

By thus constructing the heater 4, the heating bodies 4a can follow the outer periphery of the external tank 2 even if the external tank 2 is expanded or contracted depending on the heat of the heater 4. Therefore, the heat from the heater 4 can be efficiently transmitted to the external tank 2.

On the other hand, the chemical supply pipe-line 53 for connecting the chemical supply nozzle 51, which is mounted on the internal cylindrical body 25 forming the processing chamber, to the chemical supply part is formed as shown in FIGS. 1 and 3. That is, the chemical supply pipe-line 53 has a first supply pipe-line 14a for supplying the chemical in the internal tank 1 to the processing chamber, a second supply pipe-line 14b for supplying the chemical in the external tank 2 to the processing chamber, and a main supply pipe-line 14c for combining the first and second supply pipe-lines 14a and 14b. A first switching valve (supply pipe-line switching unit) 15a is provided in the first supply pipe-line 14a, and a second switching valve (supply pipe-line switching unit) 15b is provided in the second supply pipe-line 14b. In the main supply pipe-line 14c, a supply pump 16 of, e.g., a diaphragm apparatus, is provided, and a third switching valve (bypass switching unit) 15c, a filter 17 and a fourth switching valve 15d are sequentially provided on the discharge side of the supply pump 16.

The discharge side of the supply pump 16 in the main supply pipe-line 14c is connected to the external tank 2 by means of a circulating pipe-line 18, in which a fifth switching valve 15e is provided. Thus, the chemical supplied from the external tank 2 can be circulated.

A bypass pipe-line 19 is connected to the discharge side of the supply pump 16 in the main supply pipe-line 14c. Specifically, one end of the bypass pipe-line 19 is connected to a portion between the discharge side of the supply pump 16 and the third switching valve 15c, and the other end of the bypass pipe-line 19 is connected to a portion between the third switching valve 15c and the connected portion of the circulating pipe-line 18. In the bypass pipe-line 19, a sixth switching valve (bypass switching unit) 15f, a filter 19a and a seventh switching valve (bypass switching unit) 15g are sequentially provided. Between the opening portion 2b of the external tank 2 and the processing chamber, a return pipe-line 56 is provided for returning the chemical, which has been used for the process in the processing chamber, to the external tank for recycle.

By thus forming the chemical supply pipe-line 53, the chemical stored in the external tank 2 can be supplied to the processing chamber via the second supply pipe-line 14b, main supply pipe-line 14c, bypass pipe-line 19 and main supply pipe-line 14c. In addition, the chemical (new liquid) stored in the internal tank 1 can be supplied to the processing chamber via the first supply pipe-line 14a and main supply pipe-line 14c. When waiting for the wafers W to be processed, the chemical stored in the external tank 2 can be circulated via the circulating pipe-line 18.

As shown in FIGS. 3 and 4, a waste liquid discharging pipe-line 58 for discharging the recycle chemical is connected to the bottom of the external tank 2. The waste liquid discharging pipe-line 58 is connected to a lower-side pipe-line 58a for supplying the chemical to the tube 71, and a drain pipe-line 58b for discharge. In the drain pipe-line 58b, a waste liquid shut-off valve 57 is provided (see FIG. 4).

As shown in FIG. 2, the supply means 60 for supplying IPA serving as a solvent for the chemical comprises a supply nozzle 51 (commonly used by the chemical supply means 50), a solvent supply part 61, and an IPA supply pipe-line 62 for connecting the supply nozzle 51 to the chemical supply part 52. In the IPA supply pipe-line 62, a pump 54, a filter 55 and an IPA supply valve 63 are provided. The solvent supply part 61 comprises an IPA supply source 64 for supplying IPA serving as a solvent, an IPA supply tank 61a for storing therein new IPA which is supplied from the IPA supply source 64, and a circulating supply tank 61b for storing therein IPA which has been used for the process.

A first drain pipe 42 is connected to a first drain port 41 which is provided on the bottom of the internal chamber 23 on side of the divergent portion. The IPA supply tank 61b is connected to a circulating pipe-line 90, which branches from the first drain pipe 42, via a switching valve (not shown). While the IPA supply tanks 61a and 61b have been separately arranged, the IPA supply tanks 61a and 61b are preferably formed so as to have a double vessel structure similar to the chemical tank 10.

As shown in FIG. 2, the supply means 110 for supplying pure water serving as a rinsing liquid comprises a pure water supply nozzle 111 mounted on the second fixed wall 38, a pure water supply source 112, and a pure water supply pipe-line 113 for connecting the pure water supply nozzle 111 to the pure water supply source 112. In the pure water supply pipe-line 113, a supply pump 114 and a pure water supply valve 115 are provided. The pure water supply nozzle 111 is arranged outside of the internal chamber 23 and inside of the external chamber 24. Thus, when the internal cylindrical body 25 is retracted to the standby position and when the external cylindrical body 26 is moved to the position, at which the rotor 21 and the wafers W are surrounded, to form the external chamber 24, the pure water supply nozzle 111 is arranged in the external chamber 24 so as to be capable of supplying pure water to the wafers W. The pure water supply nozzle 111 may be mounted on the external chamber 24.

On the lower portion of the divergent-side portion of the external chamber 24, a second drain port 45 is provided. The second drain port 45 is connected to a second drain pipe 46, in which a shut-off valve (not shown) is provided. In the second drain pipe 46, a specific resistance meter 47 for detecting the specific resistance of pure water is provided. This specific resistance meter 47 is designed to detect the specific resistance of pure water, which has been used for a rinsing process, to transmit a signal indicative thereof to the CPU 30. Therefore, after a proper rinsing process is carried out while the specific resistance meter 47 monitors the status of the rinsing process, the rinsing process can be completed.

On the upper portion of the divergent-side portion of the external chamber 24, a second exhaust port 48 is provided. The second exhaust port 48 is connected to a second exhaust pipe 49, in which a shut-off valve (not shown) is provided.

As shown in FIGS. 1 and 2, the dry fluid supply means 80 comprises a dry fluid supply nozzle 81 mounted on the second fixed wall 38, a nitrogen gas supply source 82 for supplying nitrogen gas serving as a dry fluid, and a dry fluid supply pipe-line 83 for connecting the dry fluid supply nozzle 81 to the nitrogen gas supply source 82. In the dry fluid supply pipe-line 83, a shut-off valve 84, a filter 85 and a nitrogen gas temperature controller 86 are provided. To the secondary side of the nitrogen gas temperature controller 86 in the dry fluid supply pipe-line 83, a branching pipe-line 88 branching from the IPC supply pipe-line 62 is connected via a switching valve 87.

Similar to the pure water supply nozzle 111, the dry fluid supply nozzle 81 is arranged outside of the internal chamber 23 and inside of the external chamber 24. Thus, when the internal cylindrical body 25 is retracted to the standby position and when the external cylindrical body 26 is moved to the position, at which the rotor 21 and the wafers W are surrounded, to form the external chamber 24, the dry fluid supply nozzle 81 is arranged in the external chamber 24 so as to be capable of atomizing and supplying a mixed fluid of nitrogen gas and IPA to the wafers W. While the drying fluid has been the mixed gas of nitrogen gas and IPA, only nitrogen gas may be supplied in place of the mixed gas.

The supply pumps 16 and 54 in the chemical supply means 50, IPA supply means 60, pure water supply means 110 and dry fluid supply means 80, the first through seventh switching valves 15a through 15g of the chemical supply part 52, the temperature controller 56, the nitrogen gas temperature controller 86, the IPA supply valve 63 and the switching valve 87 are controlled by the CPU 30 (see FIG. 1).

The operation of the above described cleaning/drying apparatus will be described below.

First, the wafers W are transported from a transfer side (not shown) to a position above the processing apparatus 20, i.e., above the rotor 21 in the state that the internal cylindrical body 25 and the external cylindrical body 26 are retracted to the standby position. Then, the wafer delivering hand 29 moves upwards to deliver the wafers W which have been transported by the wafer transport chuck 10, and thereafter, the wafer delivering hand 29 moves downwards to deliver the wafers W to the fixing/holding rods 31 of the rotor 21. After the wafers W are delivered to the fixing/holding rods 31, the locking means (not shown) is operated so that the wafer presser bars 32 move to the upper edge portions of the wafers W to hold the upper portion of the wafers W.

When the wafers W are thus set in the rotor 21, the internal cylindrical body 25 and the external cylindrical body 26 move to the position, at which the rotor 21 and the wafers W are surrounded, to house the wafers W in the internal chamber 23 serving as the processing chamber. In this state, a chemical is supplied to the wafers W in the internal chamber 23 to carry out a liquid chemical process. In this chemical process, the rotor 21 and the wafers W are rotated at a low rotating speed, e.g., 1 to 500 rpm, and in this state, the chemical is supplied for a predetermined period of time, e.g., tens seconds. After the supply of the chemical is stopped, the rotor 21 and the wafers W are rotated at a high rotating speed, e.g., 100 to 3000 rpm, for a few seconds, to shake off and remove the chemical which adheres to the surfaces of the wafers W. The chemical supply step and the chemical shake-off step are repeated a few times to thousands times to complete the chemical process.

At the above described chemical processing step, in a usual process wherein the new chemicals are stored in the internal and external tanks 1 and 2, the chemical stored in the external tank 2 is used as the new chemical which is first supplied. That is, when the supply pump 15 is operated while the second, sixth, seventh and fourth switching valves 15b, 15f, 15g and 15d are open, the chemical in the external tank 2 flows through the second supply pipe-line 14b, the main supply pipe-line 14c, the bypass pipe-line 19 and the main supply pipe-line 14c to be supplied to the processing chamber. At this time, the chemical passing through the supply pump 16 is filtered by the filter 19a, so that impurities mixed in the chemical are removed. Within a certain period of time, the chemical first used is discarded from the first drain pipe 42. Other chemicals are returned to the external tank 2 after being supplied for the process for a predetermined period of time, and thereafter, supplied and circulated as recycle chemicals.

After the chemical is supplied and circulated for a predetermined period of time, the new chemical in the internal tank 1 is supplied to the processing chamber to complete the chemical process. The new chemical used in this chemical process is returned to the external tank 2 and stored as much as the chemical first discharged. Therefore, the quantity of the chemical in the external tank 2 is maintained constant before and after the process, so that the temperature fluctuation of the chemical is reduced.

When the new chemical in the internal tank 1 is supplied to the processing chamber, the above described second, sixth and seventh switching valves 15b, 15f and 15g are closed, and the first, third and fourth switching valves 15a, 15c and 15d are open. When the supply pump 16 is operated in this state, the new chemical in the internal tank 1 flows through the first supply pipe 14a and the main supply pipe 14c to be supplied to the processing chamber. At this time, the new chemical passing through the supply pump 16 is filtered by the filter 17, so that impurities mixed in the chemical are removed. The new chemical having supplied during the last process to remain in the main supply lie 14c, together with the new chemical for the next process, is filtered by the filter 17. The chemical having used for the process is returned to the external tank 2 via the return pipe-line 56, and stored as the recycle chemical.

The usual liquid-chemical process has been described in a state that the chemicals are stored in the internal tank 1 and external tank 2. In an empty state that no chemicals are stored in the internal and external tanks 1 and 2, the chemical process is carried out as follows.

First, the chemical shut-off valve 3a is open to supply the chemical from the chemical supply source 3 to the internal tank 1, and to supply a predetermined amount of chemical from the internal tank 1 to the external tank 2 via the overflow pipe-line 5 to store it therein. Then, the new chemical in the external tank 2 is supplied to the processing chamber to carry out the first chemical process. Thereafter, similar to the above described usual chemical process, the chemical in the external tank 2 is supplied and circulated, and then, the new chemical in the internal tank 1 is supplied to the processing chamber to complete the chemical process. The new chemical used in this chemical process is returned to the external tank 2 and stored as much as the chemical first discharged. Therefore, the quantity of the chemical in the external tank 2 is maintained constant before and after the process, so that the temperature fluctuation of the chemical is reduced.

At the chemical processing step, the chemical having used for the chemical process is discharged to the first drain port 41, and returned to the chemical supply part 52 via the return pipe-line 56 or discharged to the first drain pipe 42, by operating the switching valve (not shown). Gas generated from the chemical is exhausted from the first exhaust pipe 44 via the first exhaust port 43.

After the chemical process is carried out, while the wafers W are housed in the internal chamber 23, it is rotated from the chemical supply nozzle 51 also serving as the IPA supply nozzle of the IPA supply means 60 at a low rotating speed, e.g., 1 to 500 rpm. In this state, IPA is supplied for a predetermined period of time, e.g., tens seconds. After the supply of IPA is stopped, the rotor 21 and the wafers W are rotated at a high rotating speed, e.g., 100 to 3000 rpm, for a few seconds to shake off and remove IPA which adheres to the surfaces of the wafers W. The IPA supply step and the IPA shake-off step are repeated a few times to thousands times to complete the chemical removing process. Also in this chemical removing process, similar to the above described chemical processing step, IPA stored in the circulating supply tank 61b is used as IPA to be first supplied. The IPA having been first used is discarded from the first drain pipe 42. As IPA to be used for the subsequent process, IPA stored in the supply tank 61b is supplied and circulated. Then, at the end of the chemical removing process, the new IPA having supplied to the supply tank 61a from the IPA supply source 64 is used to complete the chemical removing process.

In the chemical removing process, the IPA having used for the chemical removing process is discharged to the first drain port 41, and discharged to the circulating pipe-line 90 of the solvent supply part 61 or the first drain pipe 42 by operating the switching valve (not shown). IPA gas is exhausted from the first exhaust pipe 44 via the first exhaust port 43.

After the chemical process and the rinsing process are completed, the internal cylindrical body 25 is retracted to the standby position, so that the rotor 21 and the wafers W are surrounded by the external cylindrical body 26, i.e., the wafers W are housed in the external chamber 24. Therefore, even if liquid is dropped from the wafers W having been processed in the internal chamber 23, it can be received by the external chamber 24. In this state, pure water serving as a rinsing liquid is first supplied to the rotating wafers W from the pure water supply nozzle 111 of the rinsing liquid supply means to carry out a rinsing process. The pure water having been used for the rinsing process and removed IPA are discharged from the second drain pipe 46 via the second drain port 45. Gas generated in the external chamber 24 is discharged from the second exhaust pipe 49 to the outside via the second exhaust port 48.

After the rinsing process is thus carried out for a predetermined period of time, a mixed fluid of nitrogen gas and IPA is supplied to the rotating wafers W from the nitrogen gas supply source 82 and IPA supply source 64 of the dry fluid supply means 80 while the wafers W are housed in the external chamber 24. Thus, the wafers W and the interior of the external chamber 24 can be dried by removing pure water which adheres to the surfaces of the wafers. The wafers W and the interior of the external chamber 24 can be more efficiently dried by supplying only nitrogen gas to the wafers W after the drying process is carried out by the mixed fluid of nitrogen gas and IPA.

After the chemical process, chemical removing process, rinsing process and drying process for the wafers W are thus completed, the external cylindrical body 26 is retracted to the standby position on the side of the outer periphery of the internal cylindrical body 25. On the other hand, the unlocking means (not shown) is operated to retract the water presser bars 32 from the position, at which the wafers W are pressed. Then, the wafer delivering hand 29 moves upwards to receive the wafers W, which are held by the fixing/holding rod 31 of the rotor 21, to move above the processing apparatus 20. The wafers W having moved above the processing apparatus are received by the wafer transport chuck to be transported to the transfer part, and then, transported to the outside of the apparatus.

In the above described preferred embodiment, the liquid processing apparatus and method according to the present invention applied to the cleaning/drying apparatus for the semiconductor wafers have been described. However, a liquid processing apparatus and method according to the present invention can be also applied to glass substrates for LCDs other than the semiconductor wafers, or to a liquid processing apparatus using a processing liquid, such as a chemical, other than the cleaning/drying apparatus.

Second Preferred Embodiment

Referring to FIGS. 4 and 8 through 16, the second preferred embodiment of the present invention will be described below.

Figure 8:
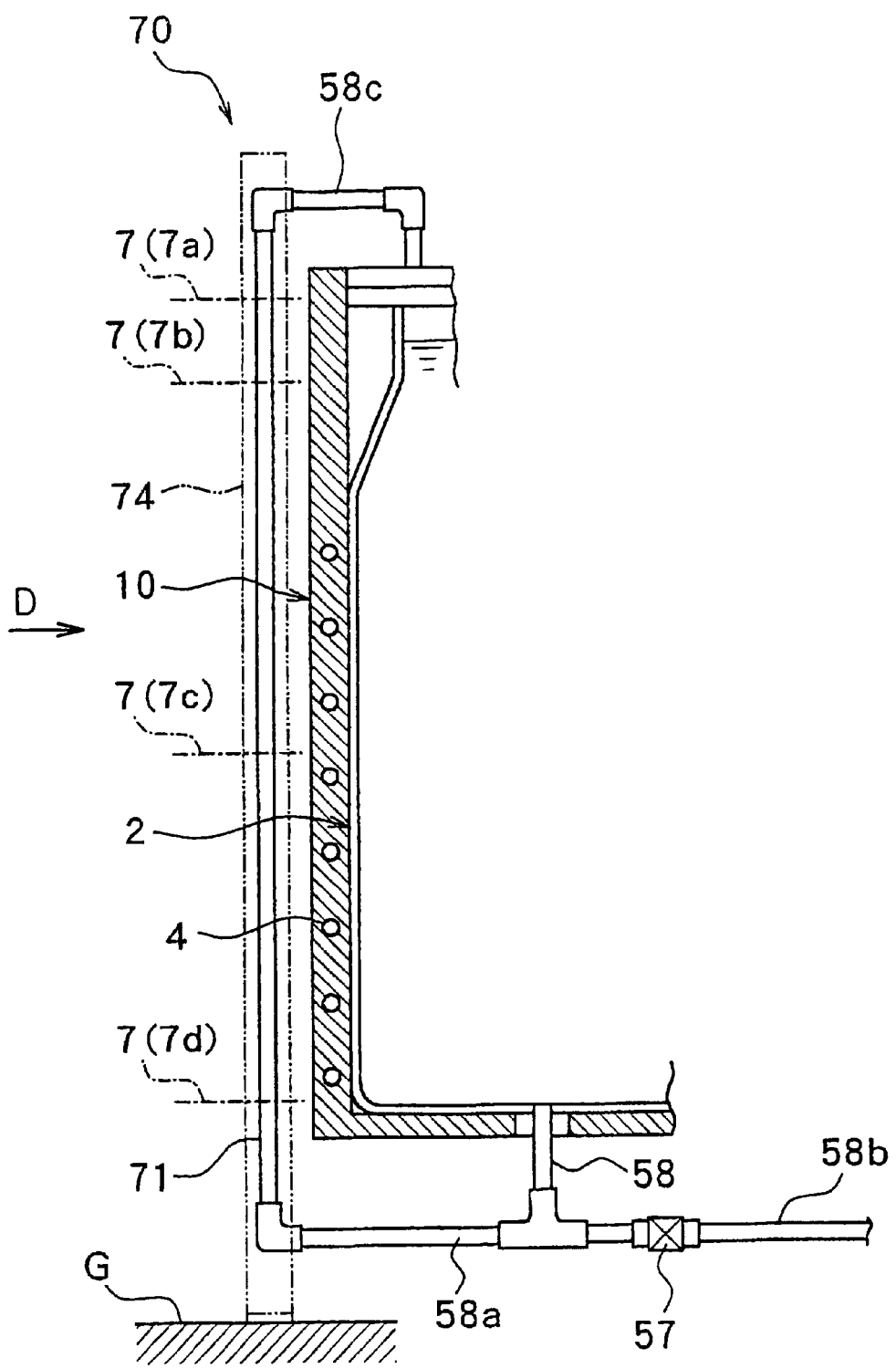
FIG. 8 is a local sectional view showing a liquid level detecting apparatus which is provided in the second preferred embodiment of a liquid processing apparatus according to the present invention.
Figure 9:
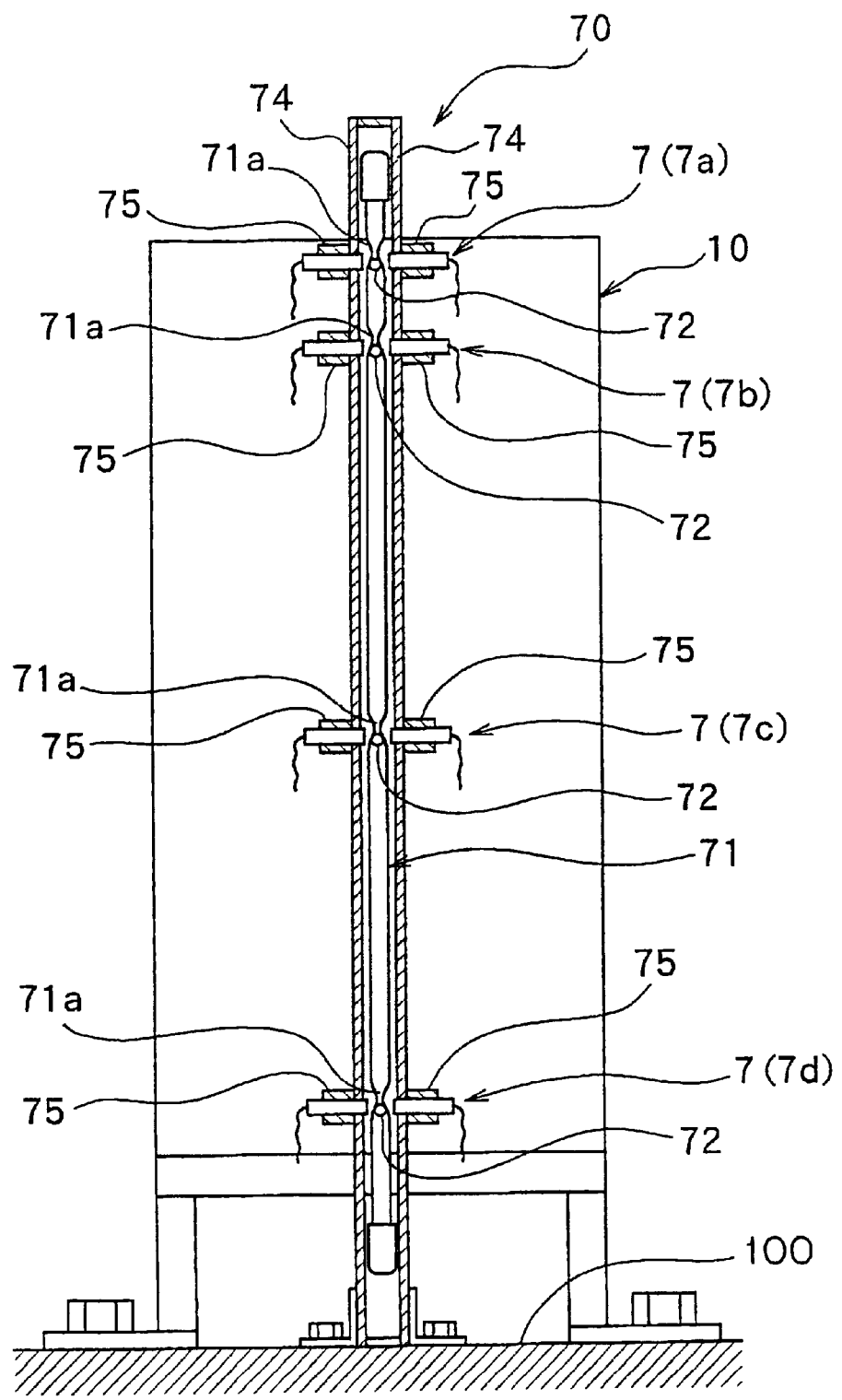
FIG. 9 is a diagram viewed from D of FIG. 8.
Figure 10:
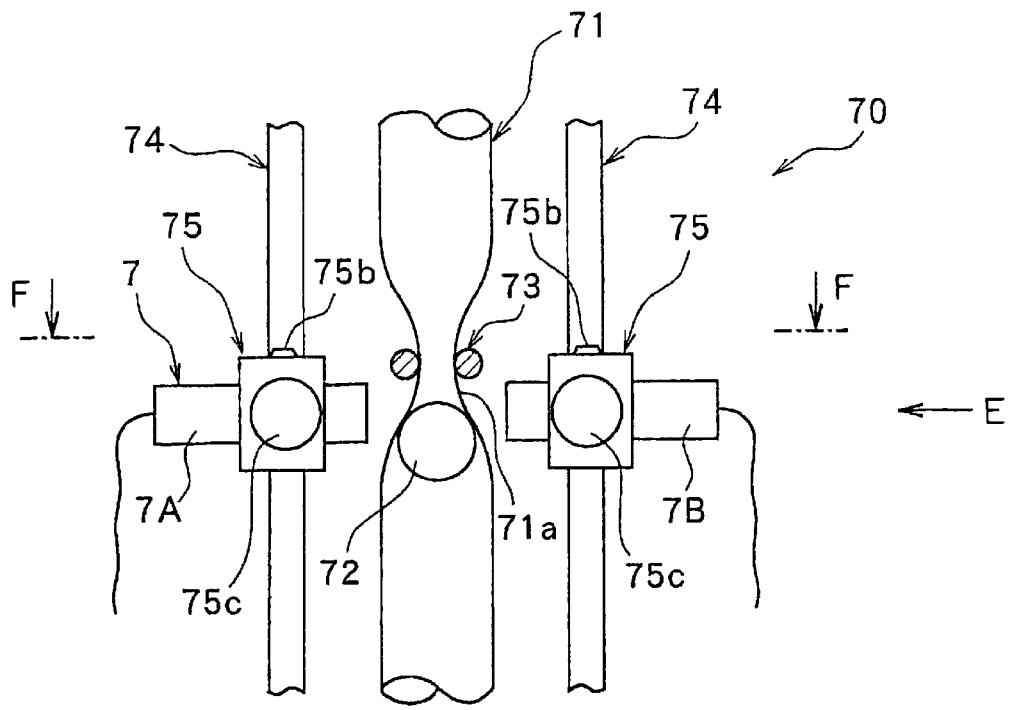
FIG. 10 is an enlarged view of a principal part of FIG. 9.

As shown in FIGS. 4 and 8, a liquid-level detecting apparatus 70 in this preferred embodiment has a transparent (light transmittable) tube 71, to which the chemical in the external tank 2 is lead, so as to provide the same liquid level as that in the external tank 2. As shown in FIGS. 9 and 10, floats 72 having a smaller specific gravity than that of the above described chemical are arranged so as to be movable in longitudinal directions. At predetermined positions of the tube 71, stopper portions 71a for inhibiting the float 72 from moving upwards are formed, and position sensors 7 for detecting the floats 72 are provided. The position sensors 7 are arranged at least at positions, at which the position sensor 7 detects the floats 72 stopped by the stopper portions 71a.

The stopper portions 71a are provided at four positions along the longitudinal directions of the tube 71, and the floats 72 and the position sensors 7 are also provided at positions corresponding to the stopper portions 71a. As shown in FIG. 10, each of the stopper portions 71a comprises a narrow portion which is formed by inwardly deforming a part of the flexible tube 71 to an extent that the movement of the corresponding float 72 is impossible. Each of the stopper portions 71a comprising the narrow portion is formed by a clip 73 which clamps the part of the tube 71 on both sides.

As shown in FIG. 10, the tube 71 is formed of a material which is transparent, flexible and resistant to high temperature, e.g., PFA (tetrafluoroethylene-perfluoroalkylvinylether copolymer). The PFA has a molecular structure wherein a perfluoroalkoxyl group is bonded to a main chain comprising carbon atoms and fluorine atoms, an excellent performance which is substantially the same as that of polytetrafluoroethylene (PTFE), and a good transparency. The PFA has an excellent dynamic property at high temperatures, and is resistant to continuous use at 250° C. Similar to general thermoplastic resins, the molded product can be produced by injection, extrusion or blow molding. The tube 71 is formed by the extrusion molding.

As shown in FIG. 8, the bottom end portion of the tube 71 is connected to the bottom of the external tank 2 via a lower-side pipe-line 58a, and the top end portion thereof is connected to a space portion, which is upper than the liquid level in the external tank 2, via an upper pipe-line 58c. As shown in FIGS. 8 and 9, supporting rails 115 are provided on both sides of the tube 71. The supporting rails 74 are provided on a base 100, on which the tank 10 is provided, so as to extend vertically from the base 100.

Figure 11:
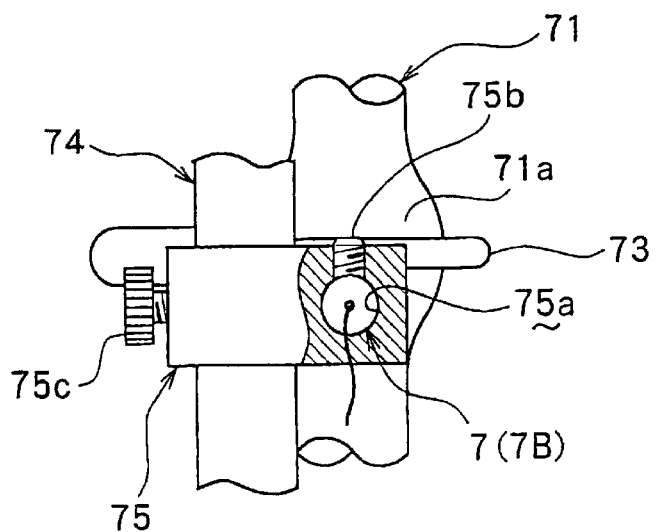
FIG. 11 is a diagram viewed from E of FIG. 10.
Figure 12:
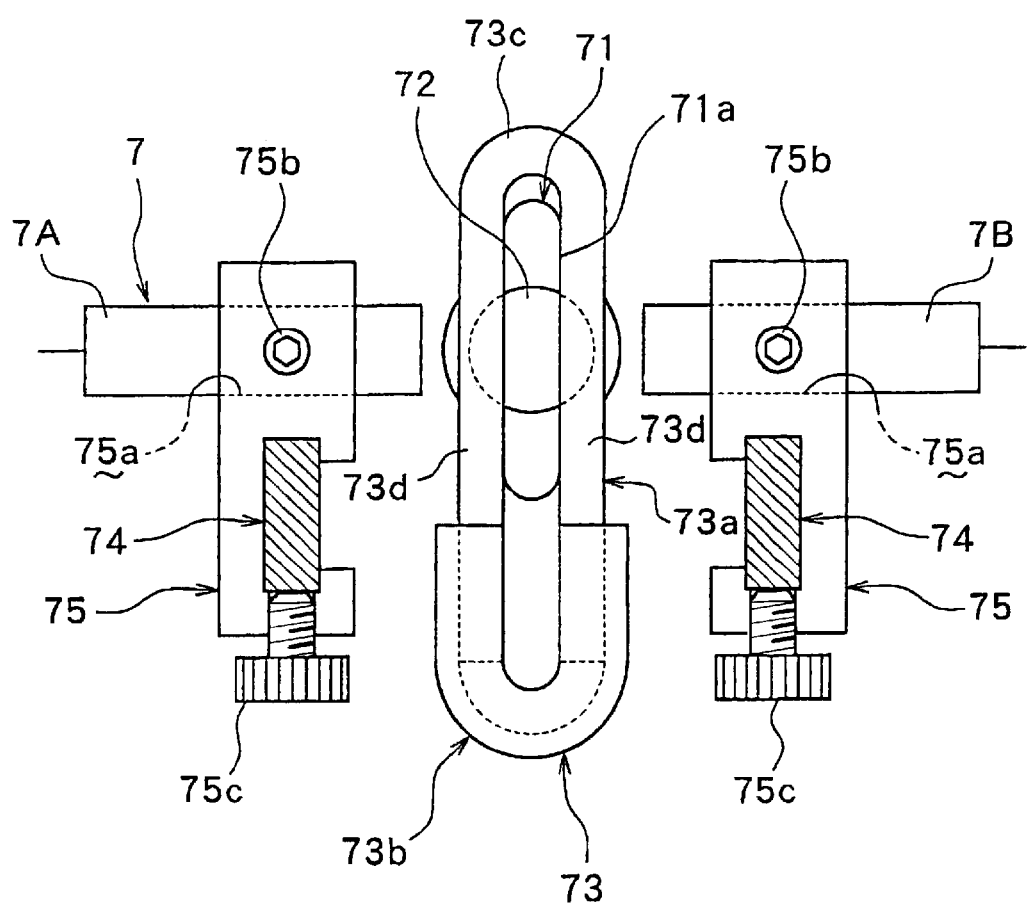
FIG. 12 is a sectional view taken along pipe-line F—F of FIG. 10.

As shown in FIGS. 10 through 12, brackets 75 for holding the position sensors 7 are provided on the supporting rails 74 so as to be movable along the supporting rails 74. Each of the brackets 75 has a cylindrical hole 75a for receiving a light emitting portion 7A or light receiving portion 7B (which will be described later) of the position sensor 7. The light emitting portion 7A or light receiving portion 7B inserted into the cylindrical hole 75a is secured by means of a set screw 75b. The bracket 75 itself is secured by means of a screw with knob 75c at a predetermined position of the supporting rail 74.

Each of the position sensors 7 comprises a light transmittable type sensor having the light emitting portion 7A and the light receiving portion 7B for receiving light from the light emitting portion 7A. That is, the float 72 serves as a shield to interrupt light which enters the light receiving portion 7B from the light emitting portion 7A, so that the position sensor 7 detects the float 72. The position of the position sensor 7 is adjusted by means of the bracket 75 to be arranged at a position, at which the position sensor 7 always detects the spherical float 72 stopped by the stopper portion 71a.

As shown in FIGS. 10 through 13, the stopper portion 71a is a narrow portion which is formed so that the tube 71 is squashed by the clip 73 in cross-sectional directions. This narrow portion is designed so as not to prevent the movement of the chemical although it prevents the upward movement of the float 72.

Figure 13:
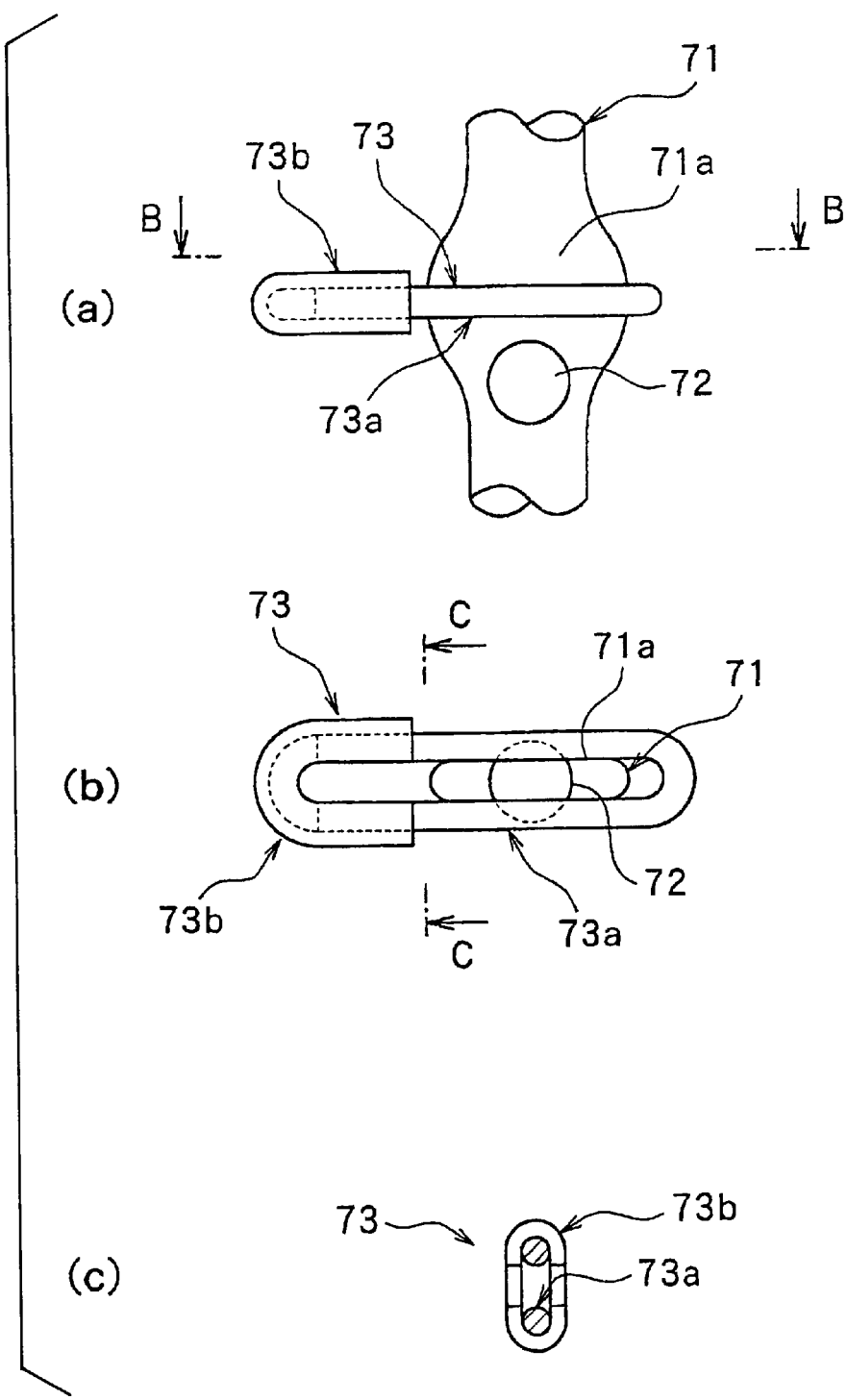
FIG. 13 shows a stopper portion of FIG. 12, wherein (a) is a front view, (b) is a sectional view taken along pipe-line B—B of (a), and (c) is a sectional view taken along pipe-line C—C of (b)
Figure 16:
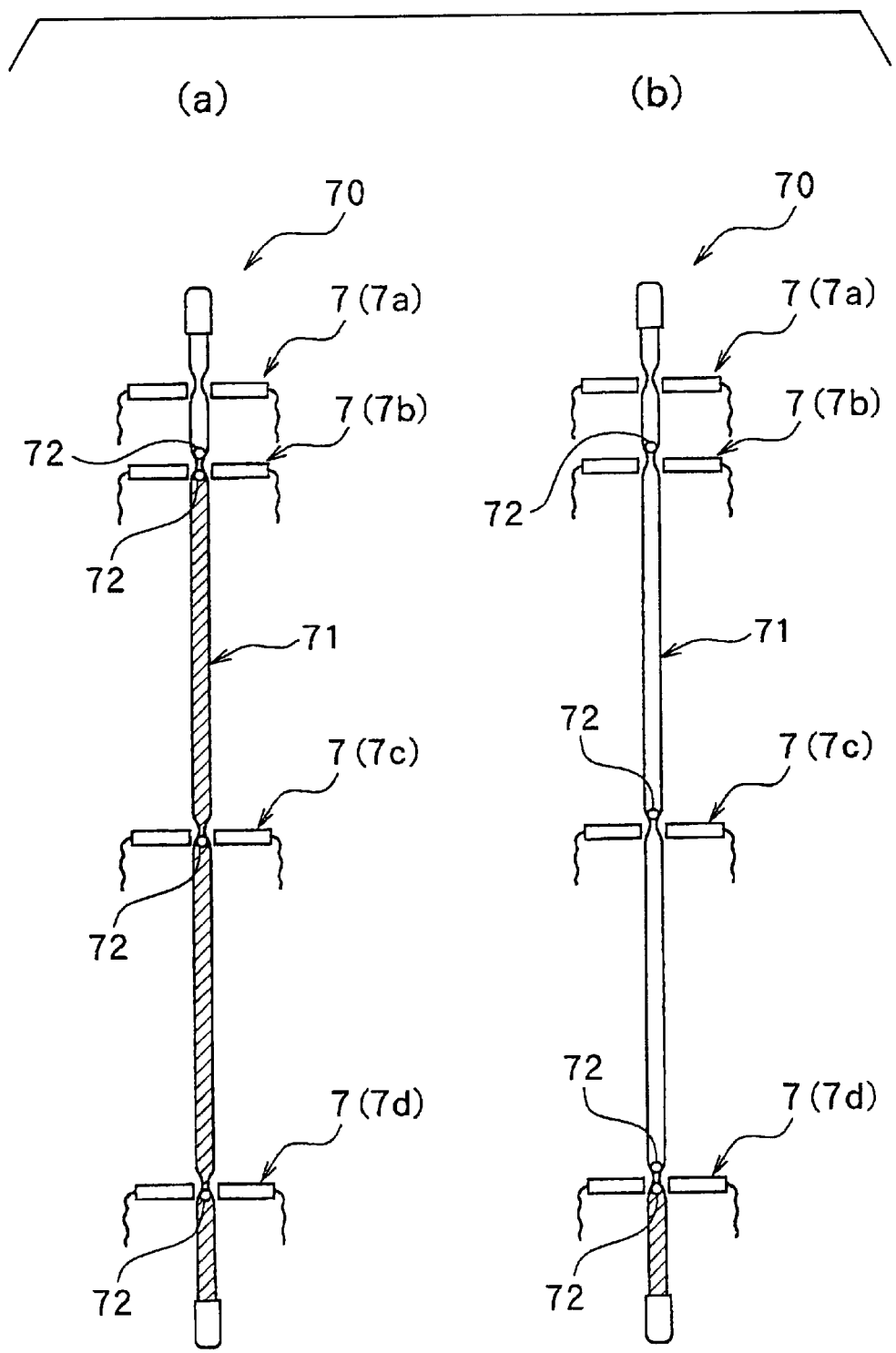
FIG. 16 shows a principal part of FIG. 9, wherein (a) shows the state that a liquid level rises up to the third stopper portion from the bottom, and (b) shows the state that the liquid level only rises up to the lowest stopper portion.

As shown in FIGS. 13 and 14, the clip 73 comprises a holding portion 73a formed of an elastic metal or plastic, and a fastening portion 73b. As shown in FIG. 14, the holding portion 73a comprises a base portion 73c, which is bent so as to have a predetermined radius, and a pair of wire portions 73d which extend from the base portion 73c so as to have a V shape and which have a circular cross section. The fastening portion 73b engages the tip end portions of the wire portions 73d while the pair of wire portions 73d are elastically deformed so as to be parallel to each other, so that the pair of wire portions 73d are maintained so as to be parallel to each other. The clip 73 is designed to form the above described stopper portion 71a by the pair of wire portions 73d which are maintained so as to be parallel to each other.

As shown in FIG. 15, the clip 73 may be formed so that one engaging portion 73e of the fastening portion 73d is secured to the tip end portion of one of the wiring portions 73d by welding or the like. In this case, the tip end portion of the other wire portion 73d engages the other engaging portion 73g of the fastening portion 73b via a U-shaped groove 73f of the fastening portion 73b.

As described above, in the liquid level detecting apparatus 70, the float 72 also moves upward with the upward movement of the liquid level in the tube 71. The upward movement of the float 72 is inhibited by the stopper portion 71a, so that the float 72 does not move above a predetermined position. The float 72 is detected by the position sensor 7 during the upward movement, and also continuously detected by the position sensor 7 after being stopped by the stopper portion 71a. Therefore, it can be determined that if the float 72 is detected by the position sensor 7, the liquid level in the external tank 2 is arranged at a position higher than the predetermined position, at which the position sensor 7 is provided, and if it is not detected, the liquid level in the external tank 2 is arranged at a position lower than the predetermined position. That is, it is possible to surely detect the position of the liquid level in the external tank 2 with respect to the predetermined position.

When the chemical is first supplied to the external tank 2, detection is started. First, when the lower limit sensor 7d detects the float 72, the replenishment of the chemical is started, and when the optimum amount sensor 7b detects the float 72, the replenishment of the chemical is stopped. The replenishment method may be a method for replenishing the chemical until the optimum amount sensor 7b detects the float 72 after the replenishment sensor 7c is turned OFF, or a method for replenishing the chemical until the optimum amount sensor 7b detects the float 72 after one process is completed.

For example, as shown in FIG. 16(a), when the first through third optimum amount sensors 7b from the bottom have detected the floats 72, respectively, it can be determined that the liquid level in the external tank 2 is higher than positions corresponding to the optimum amount sensors 7b and lower than a position corresponding to the upper limit sensor 7a. That is, it can be determined that the liquid level is normal. When the upper limit sensor 7a detects the float 72, it can be determined that there is in danger of overflow. At this time, a controller (not shown) controls so as to stop the supply of the chemical from the chemical supply source, and so as to raise the alarm.

As shown in FIG. 16(b), it can be determined that the liquid level is lower than an allowable position when the lower limit sensor 7d can not detect the float 72. At this time, the controller (not shown) controls so as to stop the heating of the external tank 2. When the replenishment sensor 7c can not detect the float 72, it can be determined that replenishment is required. In response to a signal indicative thereof, the chemical is supplied to the external tank 2. The supply of the chemical is carried out until the optimum amount sensor 7b detects the float 72.

Since the tube 71 is formed of the flexible material and since the stopper portion 71a is formed of the narrow portion which is formed by inwardly deforming the part of the tube 71, the stopper portion 71a can be formed at any position of the tube 71. Therefore, there is an advantage in that it is possible to cope with a case where the position of the liquid level is different or a case where the tank is different. The stopper portion 71a can also be simply formed by the clip 73. In this case, the narrow portion of each of the stopper portions 71a of the tube 71 is preferably formed so that the respective flow rates are the same.

Third Preferred Embodiment

Figure 17:
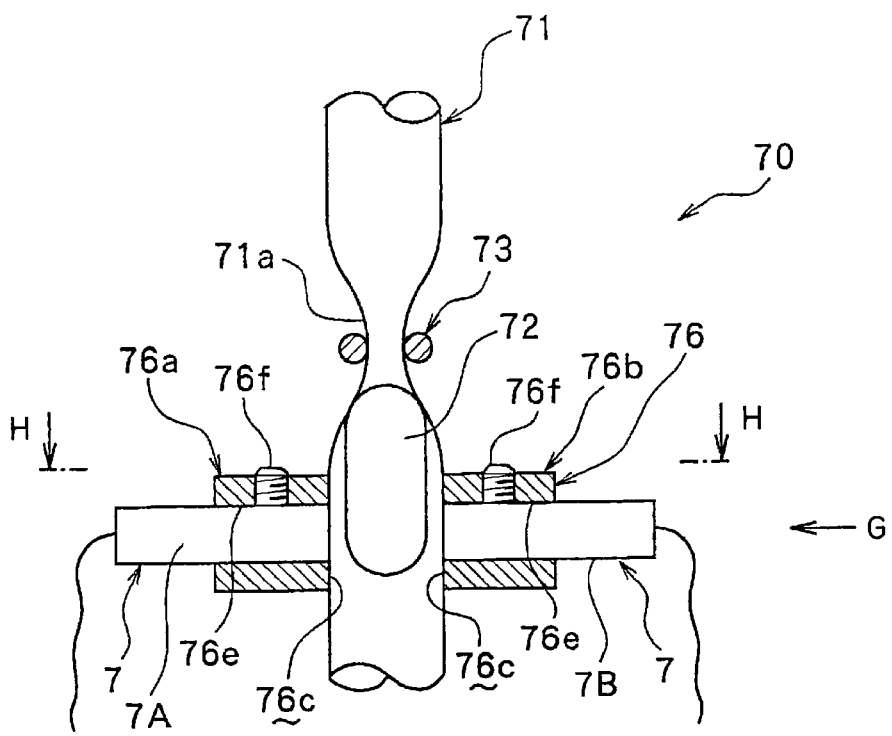
FIG. 17 is a partially sectional front view showing a principal part of a liquid level detecting apparatus which is provided in the third preferred embodiment of a liquid processing apparatus according to the present invention.
Figure 18:
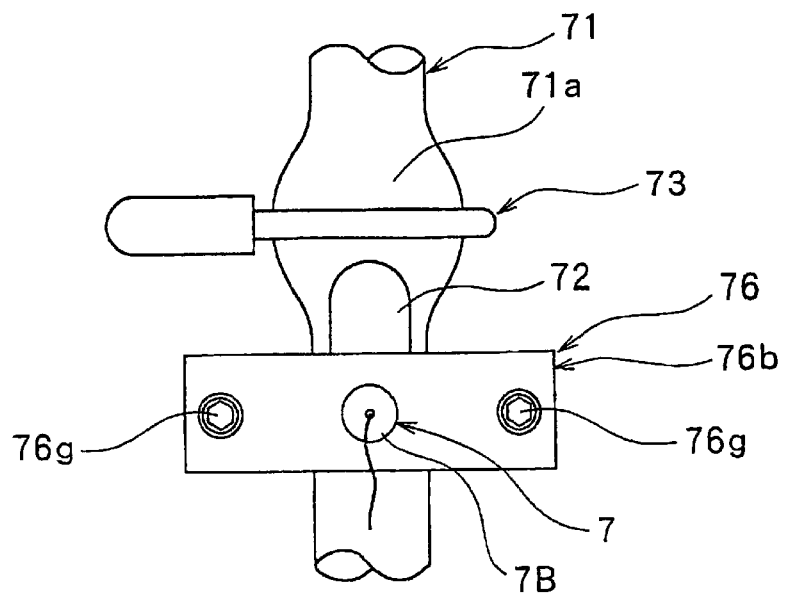
FIG. 18 is a diagram viewed from G of FIG. 17.
Figure 19:
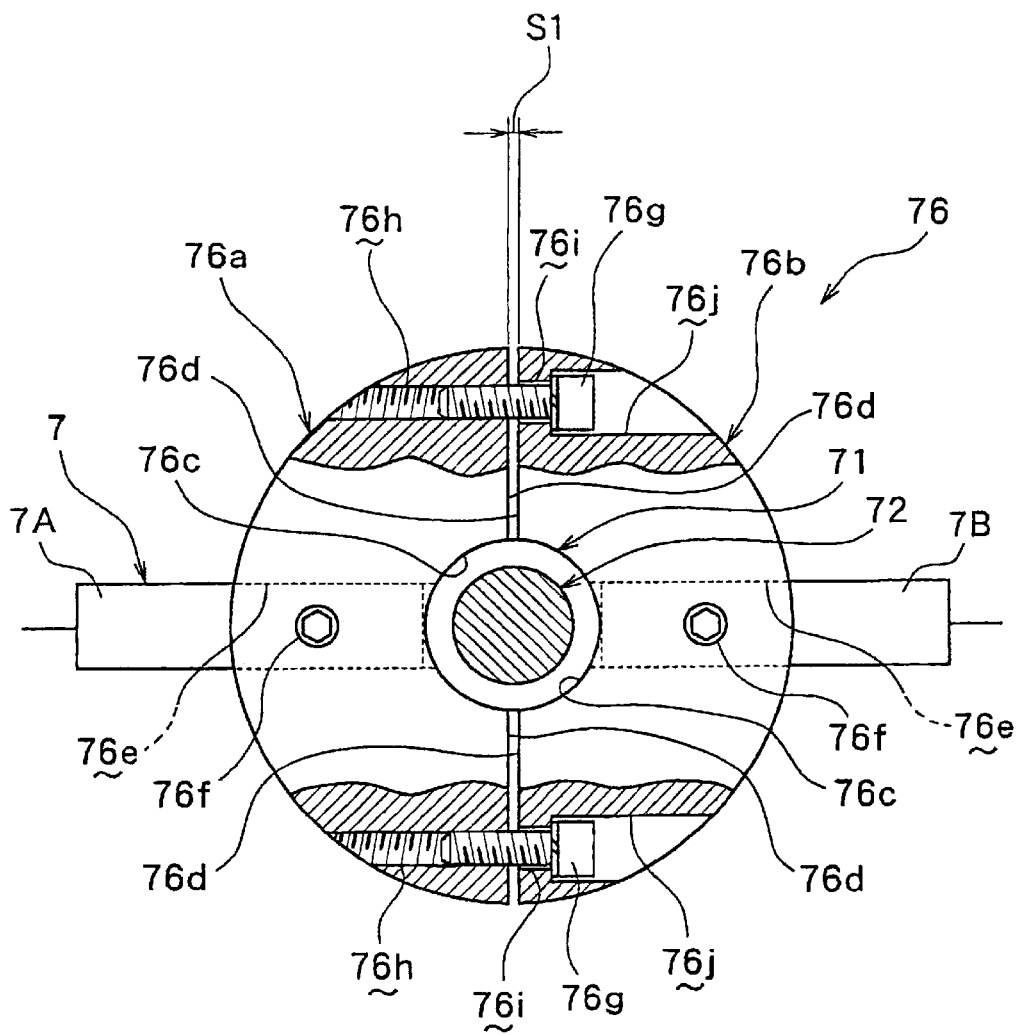
FIG. 19 is a sectional view taken along pipe-line H—H of FIG. 17.

Referring to FIGS. 17 through 19, the third preferred embodiment of the present invention will be described below. However, the same reference numbers are given to the same elements as those of the second preferred embodiment, and the descriptions thereof are simplified. The main difference between the third preferred embodiment and the second preferred embodiment is that the position sensor 7 is mounted on the tube 71 by means of a mounting means 76 in the third preferred embodiment.

The mounting means 76 is secured to the tube 71 by clamping the outer periphery of the tube 71. That is, the mounting means 76 comprises first and second semi-disk portions 76a and 76b having a shape which is formed by dividing a disk having a circular hole 76c at the center thereof into halves along a plane passing through the center thereof. As shown in FIG. 19, the semi-disk portions 76a and 76b are designed so that a gap S1 between facing surfaces 76d has a predetermined amount (about 1 to 3 mm) when the circular hole 76c contacts the outer periphery of the tube 71.

Each of the semi-disk portions 76a and 76b is formed with a cylindrical hole 76e for receiving the light emitting portion 7A or the light receiving portion 7B. The cylindrical hole 76e is formed so as to be perpendicular to the facing surface 76d and so as to extend from the circular hole 76c in radial directions. The light emitting portion 7A or the light receiving portion 7B is fixed by means of a set screw 76f while being inserted into the cylindrical hole 76e. The facing surface 76d of one of the semi-disk portions 76a is formed with screw holes 76h, each of which engages the threaded screw portion of a connection bolt 76g, and the facing surfaces 76d of the other semi-disk portions 76b is formed with through holes 76i, each of which receives the threaded portion of the connection bolt 76g. The through hole 76i is formed with a counterbore portion 76j which houses therein the head of the connection bolt 76g.

As shown in FIG. 17, the float 72 comprises a long cylinder with upper and lower hemispherical end portions.

In the mounting means 76 of the liquid level detecting apparatus 70 with the above described construction, the circular hole 76c of the semi-disk portions 76a and 76b is engaged with the outer peripheral face of the tube 71, and then, the semi-disk portions 76a and 76b are connected to each other by means of the connection bolts 76g. The semi-disk portions 76a and 76b are surely secured to the tube 71 by tightening the connection bolts 76g by predetermined amounts. Thereafter, the light emitting portion 7A or the light receiving portion 7B is inserted into each of the cylindrical holes 76e to be secured by means of the set screw 76f.

Also when the mounting means 76 is thus used, the position sensor 7 can be provided at any position of the tube 71. Since the mounting means 76 causes the outer peripheral face of the tube 71 to be inwardly and substantially uniformly pressed against the circular hole 76c, the tube 71 can be maintained to be substantially circular. That is, the tube 71 is not deformed to prevent the movement of the float 72.

Since the mounting means 76 is mounted on the portion of the circular cross section of the tube 71, the position sensor 7 is arranged at a relatively lower position with respect to the stopper portion 71a. However, since the float 72 is long, the bottom end portion of the float 72 stopped by the stopper portion 71a can be surely detected by the position sensor 7. Since the top and bottom end portions of the float 72 have hemispherical surfaces, the inner surface of the tube 71 at the stopper portion 71a is not damaged.

Fourth Preferred Embodiment

Figure 20:
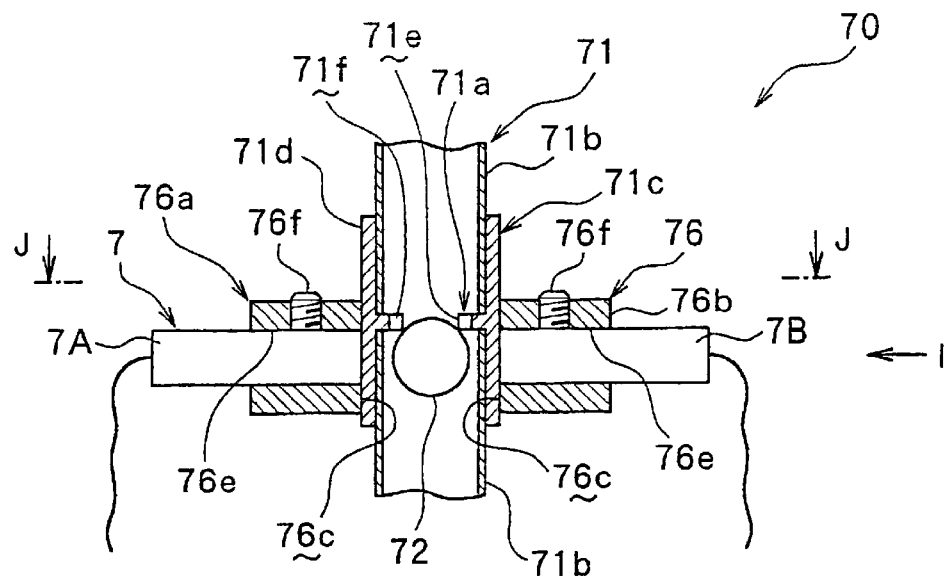
FIG. 20 is a sectional view showing a principal part of a liquid level detecting apparatus which is provided in the fourth preferred embodiment of a liquid processing apparatus according to the present invention.
Figure 21:
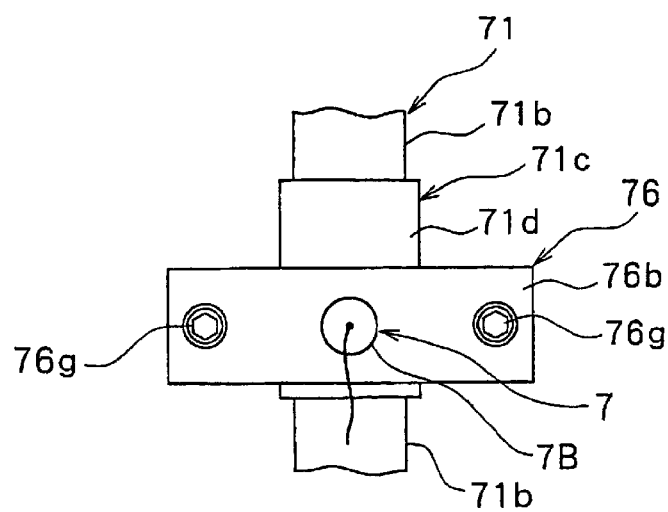
FIG. 21 is a diagram viewed from I of FIG. 20.
Figure 22:
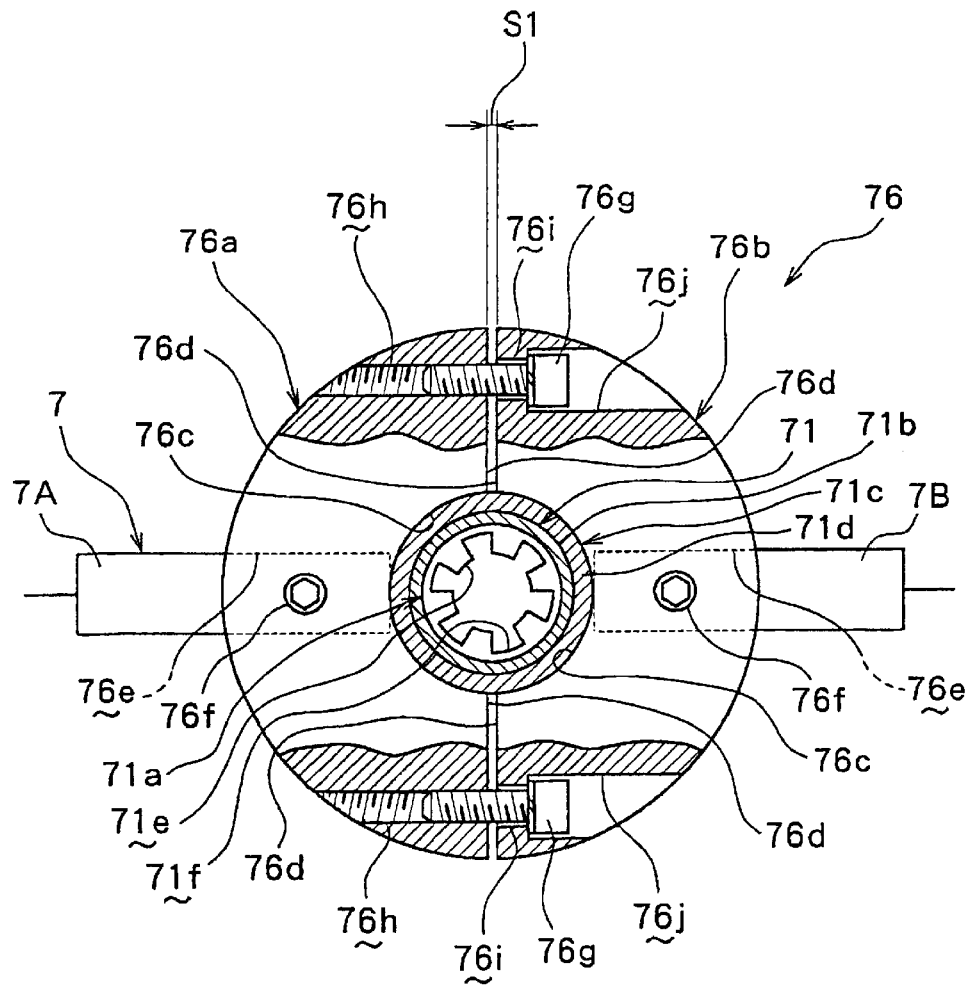
FIG. 22 is a sectional view taken along pipe-line J—J of FIG. 20.

Referring to FIGS. 20 through 22, the fourth preferred embodiment of the present invention will be described below. However, the same reference numbers are given to the same elements as those in the third preferred embodiment, and the descriptions thereof are simplified. The main different points between the fourth preferred embodiment and the third preferred embodiment are that a plurality of transparent hard pipes 71b are connected to each other by means of joints 71c to form a long tube 71 and that each of the joints 71c is formed with a stopper portion 71a.

Each of the hard pipes 71b is formed of a usual glass or quartz glass so as to have a cylindrical shape. Each of the joints 71c is formed of a transparent material, such as a usual glass or quartz glass. Each of the joints 71c comprises a cylindrical portion 71d which engages the outer peripheral face of the hard pipe 71b, and a stopper portion 71a which is provided at the center of the cylindrical portion 71d in axial directions so as to be integrally formed with the cylindrical portion 71d. The stopper portion 71a is also designed to hold the end face of the hard pipe 71b. The stopper portion 71a has a circular narrow hole 71e at its center. The diameter of the circular narrow hole 71e is designed to prevent a spherical float 72 from passing through the hole 71e. However, the narrow hole 71e is formed with a plurality of grooves 71f (see FIG. 22) so as to allow the chemical to flow through the hole 71e even if the spherical float 72 contacts the hole 71e. The hard pipe 71b and the joint 71c are secured to each other by an adhesive.

The diameter of the circular hole 76c of the mounting means 76 is designed to engage the outer peripheral face of the joint 71c.

In the liquid level detecting apparatus 70 with the above described construction, the float 72 can be detected by the transparent hard pipe 71b and the joint 71c. The position of the stopper portion 71a can also be freely changed by changing the length of the hard pipe 71b. Since the hard pipe 71b can be formed of a hard material, such as a glass, the liquid level detecting apparatus 79 can also be utilized for detecting the liquid level of a higher temperature liquid.

The joint 71c may be formed of an opaque corrosion-resistant material, such as stainless. However, in this case, as shown in FIG. 23(a), the joint 71c must be formed with a hole 71g, the size of which is designed to allow the position sensor 7 to pass through the hole 71g, or a hole, the size of which is designed to allow at least light of the position sensor 7 to pass through the hole.

As shown in FIG. 23(b), even if the above described hole 71g or the like is formed, the float 72 can be detected by mounting the mounting means 76 directly on the hard pipe 71b. In this case, since the position sensor 7 is arranged at a relatively lower position with respect to the stopper portion 71a, the float 72 stopped by the stopper portion 71a must be capable of being surely detected by forming the float 72 of a long material similar to that in the third preferred embodiment (see FIG. 17).

Figure 24:
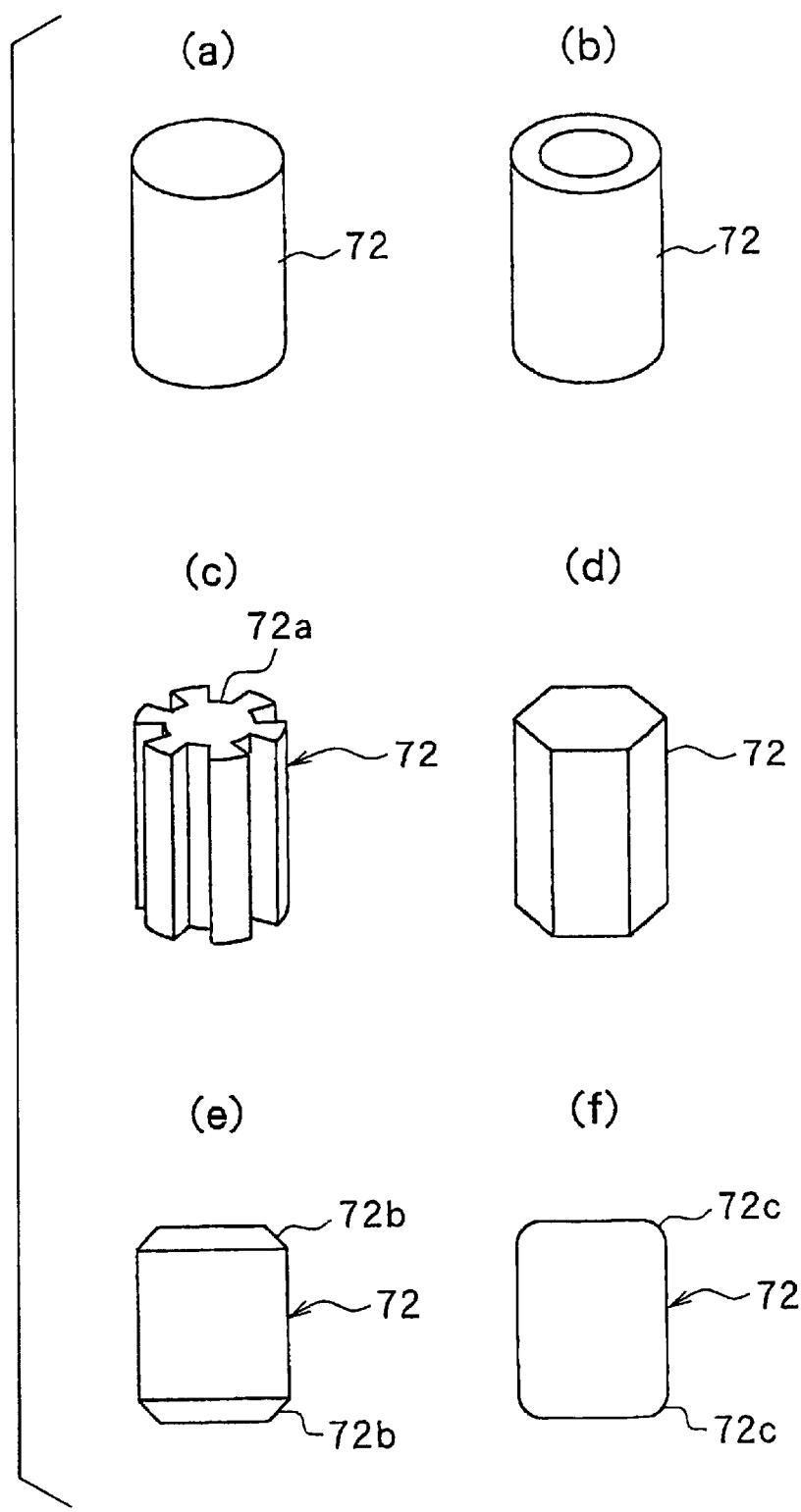
FIG. 24 shows perspective views of other examples of floats (a) through (d), and front views of floats of different chamfered shapes (e) and (f)

While the float 72 has had the spherical shape or the cylindrical shape with both spherical ends in the above described preferred embodiments, the float 72 may have a cylindrical shape shown in FIG. 24(a), a cylindrical shape shown in FIG. 24(b), a plurality of axially extending grooves 72a formed in the outer peripheral face as shown in FIG. 24(c), a hexagonal prismatic shape shown in FIG. 24(d), or another polygonal prismatic shape. With respect to the floats shown in FIGS. 24(a) through 24(d), inclined chamfered corners 72b shown in FIG. 24(e) or circular rounded chamfered corners 72c shown in FIG. 24(f) are preferably provided on the boundary portion between the outer peripheral face and the end face to prevent the stopper portion 71a from being damaged. Since each of the floats 72 shown in FIGS. 24(b) through 24(d) has a smaller cross section so that the chemical is easy to pass through the portion of the float 72, it is possible to improve the response of the variation in liquid level in the tube 71 with respect to the variation in liquid level in the external tank 2.

Figure 25:
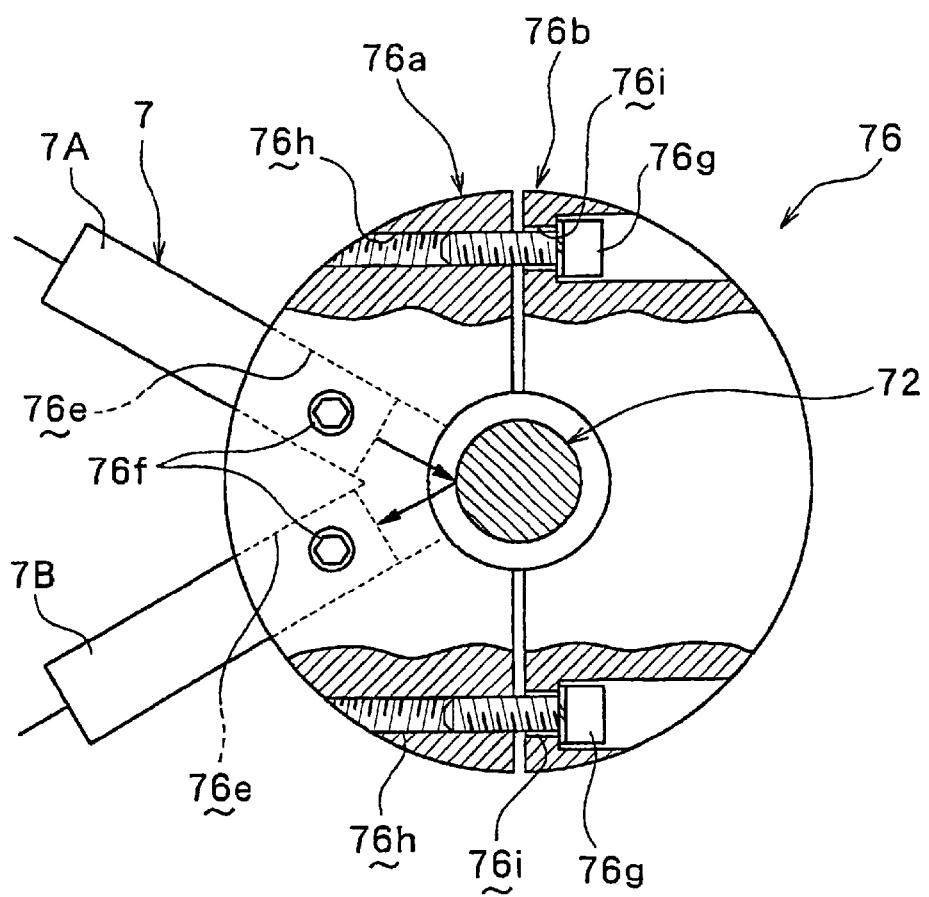
FIG. 25 is a sectional view of another example of a position sensor, which is shown so as to correspond to the sectional view of FIG. 19.

While the position sensor 7 has been the light transmittable type sensor in the above described preferred embodiments, the position sensor 7 may be a light reflex type sensor as shown in FIG. 25. That is, the position sensor 7 shown in FIG. 25 is formed by changing the light transmittable type sensor shown in FIG. 18 into a light reflex type sensor. The light reflex type position sensor 7 is designed to detect the float 72 if light emitted from the light emitting portion 7A reflects on the surface of the float 72 to enter the light receiving portion 7B. The light transmittable or light reflex type position sensor 7 preferably uses laser light having a high quantity of light.

The wire portion 73d of the clip 73 may deflect so as to have a circular-arc shape by causing the tip end portions of the V-shaped wire portion 73d to approach each other to secure the tip end portions by means of the fastening portion 73b, or by the reaction force from the tube 71. When the wire portion 73d deflects so as to have a circular-arc shape, the cross section of the stopper portion 71a is substantially elliptic. However, since this stopper portion 71a can also inhibit the movement of the float 72, there is no problem.

The tube 71 may comprise the above described hard pipe 71b and a soft pipe connected thereto, and the stopper portion 71a may be formed of the clip 73 at the portion of the soft pipe.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A liquid processing apparatus comprising:
   a processing chamber for processing an object to be processed, with a processing liquid;
   a processing liquid tank for storing therein said liquid, said processing liquid tank having an external tank and an internal tank which is housed in said external tank;
   a supply pipe-line for supplying said liquid to said chamber from said external tank and said internal tank, said supply pipe-line having a first supply pipe-line connected to said internal tank and a second supply pipe-line connected to said external tank; and
   a return pipe-line for returning said liquid from said chamber to said external tank.

2. A liquid processing apparatus as set for in claim 1, which further comprises:

a processing liquid supply source for supplying said liquid;

a processing liquid pipe-line for supplying said liquid from said source to said internal tank; and an overflow pipe-line for supplying a part of said liquid, which overflows said internal tank, to said external tank.

3. A liquid processing apparatus as set forth in claim 1, wherein said supply pipe-line further has:

a first supply pipe-line connected to said external tank;

a second supply pipe-line connected to said internal tank;

a main supply pipe-line, into which said first and second pipe-lines are combined;

a supply pipe-line switching apparatus for switching a pipe-line, which is communicated with said main supply pipe-line, between said first supply pipe-line and said second supply pipe-line; and a supply pump provided in said main supply pipe-line.

4. A liquid processing apparatus as set forth in claim 3, which further comprises a circulating pipe-line connecting a discharge side of said supply pump in said main supply pipe-line to said external tank.

5. A liquid processing apparatus as set forth in claim 3, wherein said supply pipe-line further comprises:

a first filter provided in said main supply line;

a bypass pipe-line connecting a discharge side of said supply pump and a downstream side of said first filter in said main supply pipe-line so as to bypass said first filter; and a bypass switching apparatus for switching a flow route of said processing liquid from said supply pump between a first route flowing through said first filter and a second route flowing through said second filter.

6. A liquid processing apparatus as set forth in claim 1, wherein said external tank has a barrel portion and an opening portion provided in an upper portion of said barrel portion, said processing apparatus further comprising:

a purge gas supply pipe-line, which is connected to said opening portion of said external tank, for supplying a purge gas to said external tank; and a vent pipe-line for exhausting said purge gas which is supplied to said external tank by said purge gas supply pipe-line.

7. A liquid processing apparatus, comprising:

a processing chamber for processing an object to be processed, with a processing liquid;

a processing liquid tank for storing therein said liquid, said processing liquid tank having an external tank and an internal tank which is housed in said external tank;

a supply pipe-line for supplying said liquid to said chamber from said external tank and said internal tank; and a return pipe-line for returning said liquid from said chamber to said external tank;

wherein said external tank has a barrel portion and an opening portion provided in an upper portion of said barrel portion; and wherein a gap size between said external tank and said internal tank at said opening portion is greater than one half inch, and designed so that a cross section of said external tank at said opening portion is smaller than a cross section of said external tank at said barrel portion.

8. A liquid processing apparatus as set forth in claim 7, said processing apparatus further comprising:

a purge gas supply pipe-line, which is connected to said opening portion of said external tank, for supplying a purge gas to said external tank; and a vent pipe-line for exhausting said purge gas which is supplied to said external tank by said purge gas supply pipe-line.

* * * * *